United States Patent
Liu et al.

(10) Patent No.: US 7,323,416 B2
(45) Date of Patent: Jan. 29, 2008

(54) METHOD AND COMPOSITION FOR POLISHING A SUBSTRATE

(75) Inventors: Feng Q. Liu, San Jose, CA (US); Tianbao Du, Santa Clara, CA (US); Alain Duboust, Sunnyvale, CA (US); Yan Wang, Sunnyvale, CA (US); Yongqi Hu, San Jose, CA (US); Stan D. Tsai, Fremont, CA (US); Liang-Yuh Chen, Foster City, CA (US); Wen-Chiang Tu, Mountainview, CA (US); Wei-Yung Hsu, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 19 days.

(21) Appl. No.: 11/196,876

(22) Filed: Aug. 4, 2005

(65) Prior Publication Data

US 2006/0006074 A1 Jan. 12, 2006

Related U.S. Application Data

(63) Continuation-in-part of application No. 11/123,274, filed on May 5, 2005, which is a continuation-in-part of application No. 10/845,754, filed on May 14, 2004, which is a continuation-in-part of application No. 10/456,220, filed on Jun. 6, 2003, which is a continuation-in-part of application No. 10/378,097, filed on Feb. 26, 2003, now Pat. No. 7,128,825, and a continuation-in-part of application No. 10/038,066, filed on Jan. 3, 2002, now Pat. No. 6,811,680, application No. 11/196,876, which is a continuation-in-part of application No. 11/074,274, filed on Mar. 7, 2005, which is a continuation of application No. 10/141,459, filed on May 7, 2002, now Pat. No. 6,863,797, which is a continuation-in-part of application No. 10/032,275, filed on Dec. 21, 2001, now Pat. No. 6,899,804, application No. 11/196,876, which is a continuation-in-part of application No. 10/608,404, filed on Jun. 26, 2003, which is a continuation-in-part of application No. 10/038,066, filed on Jan. 3, 2002, now Pat. No. 6,811,680, and a continuation-in-part of application No. 10/032,275, filed on Dec. 21, 2001, now Pat. No. 6,899,804.

(60) Provisional application No. 60/359,746, filed on Feb. 26, 2002, provisional application No. 60/275,874, filed on Mar. 14, 2001.

(51) Int. Cl.
H01L 21/302 (2006.01)

(52) U.S. Cl. .................. 438/692; 438/689; 216/88; 216/89; 252/79.1; 451/41; 451/36

(58) Field of Classification Search ................ 438/692; 216/88; 451/41
See application file for complete search history.

(56) References Cited

U.S. PATENT DOCUMENTS

| | | |
|---|---|---|
| 2,582,020 A | 1/1952 | Emery |
| 3,239,441 A | 3/1966 | Marosi |
| 3,873,512 A | 3/1975 | Latanision |
| 4,263,113 A | 4/1981 | Bernard |
| 4,369,099 A | 1/1983 | Kohl et al. |
| 4,663,005 A | 5/1987 | Edson |
| 4,666,683 A | 5/1987 | Brown et al. |
| 4,793,895 A | 12/1988 | Kaanta et al. |
| 4,934,102 A | 6/1990 | Leach et al. |
| 4,992,135 A | 2/1991 | Doan |
| 5,002,645 A | 3/1991 | Eastland et al. |
| 5,096,550 A | 3/1992 | Mayer et al. |
| 5,114,548 A | 5/1992 | Rhoades |
| 5,129,981 A | 7/1992 | Wang et al. |
| 5,209,816 A | 5/1993 | Yu et al. |
| 5,217,586 A | 6/1993 | Datta et al. |
| 5,225,034 A | 7/1993 | Yu et al. |
| 5,256,565 A | 10/1993 | Bernhardt et al. |
| 5,340,370 A | 8/1994 | Cadien et al. |
| 5,391,258 A | 2/1995 | Brancaleoni et al. |
| 5,407,526 A | 4/1995 | Danielson et al. |
| 5,534,106 A | 7/1996 | Cote et al. |
| 5,543,032 A | 8/1996 | Datta et al. |

| | | | | | | |
|---|---|---|---|---|---|---|
| 5,567,300 | A | 10/1996 | Datta et al. | 6,428,721 B1 | 8/2002 | Ina et al. |
| 5,575,706 | A | 11/1996 | Tsai et al. | 6,429,133 B1 | 8/2002 | Chopra |
| 5,770,095 | A | 6/1998 | Sasaki et al. | 6,440,186 B1 | 8/2002 | Sakai et al. |
| 5,783,489 | A | 7/1998 | Kaufman et al. | 6,440,295 B1 | 8/2002 | Wang |
| 5,800,577 | A | 9/1998 | Kido | 6,447,371 B2 | 9/2002 | Brusic Kaufman et al. |
| 5,804,507 | A | 9/1998 | Perlov et al. | 6,447,668 B1 | 9/2002 | Wang |
| 5,807,165 | A | 9/1998 | Uzoh et al. | 6,454,819 B1 | 9/2002 | Yano et al. |
| 5,843,032 | A | 12/1998 | Kastenhofer | 6,455,479 B1 | 9/2002 | Sahbari |
| 5,846,882 | A | 12/1998 | Birang | 6,508,952 B1 | 1/2003 | Lee et al. |
| 5,866,031 | A | 2/1999 | Carprio et al. | 6,541,384 B1 | 4/2003 | Sun et al. |
| 5,880,003 | A | 3/1999 | Hayashi | 6,551,935 B1 | 4/2003 | Sinha et al. |
| 5,897,375 | A | 4/1999 | Watts et al. | 6,555,158 B1 | 4/2003 | Yoshio et al. |
| 5,911,619 | A | 6/1999 | Uzoh et al. | 6,562,719 B2 | 5/2003 | Kondo et al. |
| 5,954,997 | A | 9/1999 | Kaufman et al. | 6,565,619 B1 | 5/2003 | Asano et al. |
| 5,965,036 | A | 10/1999 | Maki et al. | 6,568,997 B2 | 5/2003 | Costas et al. |
| 6,001,730 | A | 12/1999 | Farkas et al. | 6,569,349 B1 | 5/2003 | Wang et al. |
| 6,004,880 | A | 12/1999 | Liu et al. | 6,579,153 B2 | 6/2003 | Uchikura et al. |
| 6,056,864 | A | 5/2000 | Cheung | 6,582,579 B1 | 6/2003 | Uzoh |
| 6,063,306 | A | 5/2000 | Kaufman et al. | 6,592,742 B2 | 7/2003 | Sun et al. |
| 6,066,030 | A | 5/2000 | Uzoh | 6,593,239 B2 | 7/2003 | Kaufman et al. |
| 6,068,879 | A | 5/2000 | Pasch | 6,596,152 B2 | 7/2003 | Yang et al. |
| 6,077,412 | A | 6/2000 | Ting et al. | 6,596,638 B1 | 7/2003 | Kondo et al. |
| 6,083,840 | A | 7/2000 | Mravic et al. | 6,602,112 B2 | 8/2003 | Tran et al. |
| 6,090,239 | A | 7/2000 | Liu et al. | 6,605,537 B2 | 8/2003 | Bian et al. |
| 6,096,652 | A | 8/2000 | Watts et al. | 6,613,200 B2 | 9/2003 | Li et al. |
| 6,099,604 | A | 8/2000 | Sandhu et al. | 6,616,976 B2 | 9/2003 | Montano et al. |
| 6,103,096 | A | 8/2000 | Datta et al. | 6,620,215 B2 | 9/2003 | Li et al. |
| 6,106,728 | A | 8/2000 | Iida et al. | 6,653,242 B1 | 11/2003 | Sun et al. |
| 6,117,775 | A | 9/2000 | Kondo et al. | 6,676,484 B2 | 1/2004 | Chopra |
| 6,117,783 | A | 9/2000 | Small et al. | 6,679,928 B2 | 1/2004 | Costas et al. |
| 6,117,853 | A | 9/2000 | Sakai et al. | 6,679,929 B2 | 1/2004 | Asano et al. |
| 6,121,152 | A | 9/2000 | Adams et al. | 6,693,036 B1 | 2/2004 | Nogami et al. |
| 6,126,798 | A | 10/2000 | Reid et al. | 6,699,299 B2 | 3/2004 | Sachan et al. |
| 6,126,853 | A | 10/2000 | Kaufman et al. | 6,736,952 B2 | 5/2004 | Emesh et al. |
| 6,139,763 | A | 10/2000 | Ina et al. | 6,811,680 B2 | 11/2004 | Chen et al. |
| 6,143,155 | A | 11/2000 | Adams et al. | 6,821,409 B2 | 11/2004 | Basol et al. |
| 6,143,656 | A | 11/2000 | Yang et al. | 6,821,881 B2 | 11/2004 | Tsai et al. |
| 6,153,043 | A | 11/2000 | Edelstein et al. | 6,837,983 B2 | 1/2005 | Duboust et al. |
| 6,171,352 | B1 | 1/2001 | Lee et al. | 6,852,630 B2 | 2/2005 | Basol et al. |
| 6,176,992 | B1 | 1/2001 | Talieh | 6,867,136 B2 | 3/2005 | Basol et al. |
| 6,177,026 | B1 | 1/2001 | Wang et al. | 6,893,476 B2 | 5/2005 | Siddiqui et al. |
| 6,190,237 | B1 | 2/2001 | Huyng et al. | 6,899,804 B2 | 5/2005 | Duboust et al. |
| 6,194,317 | B1 | 2/2001 | Kaisaki et al. | 6,902,659 B2 | 6/2005 | Talieh |
| 6,206,756 | B1 | 3/2001 | Chopra et al. | 6,943,112 B2 | 9/2005 | Basol et al. |
| 6,217,416 | B1 | 4/2001 | Kaufman et al. | 6,946,066 B2 | 9/2005 | Basol et al. |
| 6,218,305 | B1 | 4/2001 | Hosali et al. | 2001/0016469 A1 | 8/2001 | Chopra |
| 6,234,870 | B1 | 5/2001 | Uzoh et al. | 2001/0024878 A1 | 9/2001 | Nakamura |
| 6,238,592 | B1 | 5/2001 | Hardy et al. | 2001/0036746 A1 | 11/2001 | Sato et al. |
| 6,248,222 | B1 | 6/2001 | Wang | 2001/0042690 A1 | 11/2001 | Talieh |
| 6,258,711 | B1 | 7/2001 | Laursen | 2001/0052351 A1 | 12/2001 | Brown et al. |
| 6,258,721 | B1 | 7/2001 | Li et al. | 2002/0008036 A1 | 1/2002 | Wang |
| 6,273,786 | B1 | 8/2001 | Chopra et al. | 2002/0016064 A1 | 2/2002 | Komai et al. |
| 6,276,996 | B1 | 8/2001 | Chopra | 2002/0016073 A1 | 2/2002 | Kondo et al. |
| 6,280,598 | B1 | 8/2001 | Barton et al. | 2002/0016272 A1 | 2/2002 | Kakizawa et al. |
| 6,296,400 | B1 | 10/2001 | Uchiyama et al. | 2002/0040100 A1 | 4/2002 | Kume et al. |
| 6,299,741 | B1 | 10/2001 | Sun et al. | 2002/0070126 A1 | 6/2002 | Sato et al. |
| 6,303,049 | B1 | 10/2001 | Lee et al. | 2002/0072309 A1 | 6/2002 | Sato et al. |
| 6,303,551 | B1 | 10/2001 | Li et al. | 2002/0074230 A1 | 6/2002 | Basol |
| 6,310,019 | B1 | 10/2001 | Kakizawa et al. | 2002/0088709 A1 | 7/2002 | Hongo et al. |
| 6,315,803 | B1 | 11/2001 | Ina et al. | 2002/0096659 A1 | 7/2002 | Sakai et al. |
| 6,315,883 | B1 | 11/2001 | Mayer et al. | 2002/0104764 A1 | 8/2002 | Gautum et al. |
| 6,348,076 | B1 | 2/2002 | Canaperi et al. | 2002/0108861 A1 | 8/2002 | Emesh et al. |
| 6,354,916 | B1 | 3/2002 | Uzoh et al. | 2002/0119286 A1 | 8/2002 | Chen et al. |
| 6,355,075 | B1 | 3/2002 | Ina et al. | 2002/0130049 A1 | 9/2002 | Chen et al. |
| 6,355,153 | B1 | 3/2002 | Uzoh et al. | 2002/0139055 A1 | 10/2002 | Asano et al. |
| 6,361,422 | B1 | 3/2002 | Ettinger et al. | 2002/0160698 A1 | 10/2002 | Sato et al. |
| 6,375,693 | B1 | 4/2002 | Cote et al. | 2002/0182982 A1* | 12/2002 | Li et al. ............. 451/41 |
| 6,379,223 | B1 | 4/2002 | Sun et al. | 2003/0010648 A1* | 1/2003 | Sun et al. ............. 205/640 |
| 6,391,166 | B1 | 5/2002 | Wang | 2003/0019755 A1 | 1/2003 | Hey et al. |
| 6,395,152 | B1 | 5/2002 | Wang | 2003/0038038 A1 | 2/2003 | Basol et al. |
| 6,402,925 | B2 | 6/2002 | Talieh | 2003/0073311 A1 | 4/2003 | Joseph et al. |
| 6,416,685 | B1 | 7/2002 | Zhang et al. | 2003/0073386 A1 | 4/2003 | Ma et al. |
| 6,419,554 | B2 | 7/2002 | Chopra et al. | 2003/0079416 A1 | 5/2003 | Ma et al. |

| | | | |
|---|---|---|---|
| 2003/0083214 A1 | 5/2003 | Kakizawa et al. | |
| 2003/0104762 A1 | 6/2003 | Sato et al. | |
| 2003/0113996 A1 | 6/2003 | Nogami et al. | |
| 2003/0114004 A1 | 6/2003 | Sato et al. | |
| 2003/0115475 A1 | 6/2003 | Russo et al. | |
| 2003/0116445 A1 | 6/2003 | Sun et al. | |
| 2003/0116446 A1 | 6/2003 | Duboust et al. | |
| 2003/0119311 A1 | 6/2003 | Basol et al. | |
| 2003/0136055 A1 | 7/2003 | Li et al. | |
| 2003/0153184 A1 | 8/2003 | Wang et al. | |
| 2003/0170091 A1 | 9/2003 | Shomler et al. | |
| 2003/0178320 A1 | 9/2003 | Liu et al. | |
| 2003/0216045 A1 | 11/2003 | Wang et al. | |
| 2003/0234184 A1 | 12/2003 | Liu et al. | |
| 2004/0053499 A1 | 3/2004 | Liu et al. | |
| 2004/0144038 A1 | 7/2004 | Siddiqui | |
| 2004/0231994 A1 | 11/2004 | Basol et al. | |
| 2004/0248412 A1 | 12/2004 | Liu et al. | |
| 2005/0044803 A1 | 3/2005 | Siddiqui et al. | |
| 2005/0056537 A1 | 3/2005 | Chen et al. | |
| 2005/0076578 A1 | 4/2005 | Siddiqui et al. | |
| 2005/0076579 A1 | 4/2005 | Siddiqui et al. | |
| 2005/0079718 A1 | 4/2005 | Siddiqui et al. | |
| 2005/0079803 A1 | 4/2005 | Siddiqui et al. | |
| 2005/0145507 A1 | 7/2005 | Sun et al. | |
| 2005/0218010 A1 | 10/2005 | Wang et al. | |
| 2005/0227483 A1 | 10/2005 | Basol et al. | |
| 2006/0006074 A1 | 1/2006 | Liu et al. | |
| 2006/0011485 A1 | 1/2006 | Basol et al. | |

FOREIGN PATENT DOCUMENTS

| | | |
|---|---|---|
| EP | 0 527 537 | 2/1993 |
| EP | 0 699 782 | 3/1996 |
| EP | 0 811 665 | 12/1997 |
| EP | 0 846 742 | 6/1998 |
| EP | 1 103 346 | 5/2001 |
| EP | 1 167 585 | 1/2002 |
| EP | 1 170 761 | 9/2002 |
| EP | 1 410 430 | 4/2004 |
| JP | 58-093886 | 6/1983 |
| JP | 58-093899 | 6/1983 |
| JP | 05 302199 | 11/1993 |
| JP | 06 158397 | 6/1994 |
| JP | 10 121297 | 5/1998 |
| JP | 2000 192298 | 7/2000 |
| JP | 2000 256898 | 9/2000 |
| JP | 2001-77117 | 3/2001 |
| SU | 1 618 538 | 1/1991 |
| WO | WO 98/04646 | 2/1998 |
| WO | WO 98/49723 | 11/1998 |
| WO | WO 99/46081 | 9/1999 |
| WO | WO 99/46353 | 9/1999 |
| WO | WO 99/53532 | 10/1999 |
| WO | WO 99/65072 | 12/1999 |
| WO | WO 00/03426 | 1/2000 |
| WO | WO 00/26443 | 5/2000 |
| WO | WO 00/55876 | 9/2000 |
| WO | WO 01/77241 | 10/2001 |
| WO | WO 02/23616 | 3/2002 |
| WO | WO 02/75804 | 9/2002 |
| WO | WO 02/88229 | 11/2002 |
| WO | WO 03/009361 | 1/2003 |
| WO | WO 03/60962 | 7/2003 |
| WO | WO 03/72672 | 9/2003 |
| WO | WO 03/087436 | 10/2003 |
| WO | WO 03/088316 | 10/2003 |

OTHER PUBLICATIONS

First Official Letter dated May 26, 2006 for Chinese National Application No. 03807940.2.
Translation of First Official Letter dated May 26, 2006 for Chinese National Application No. 03807940.2.
PCT IPRP and Written Opinion dated Dec. 22, 2005.
International Search Report and the Written Opinion for International Application No. PCT/US2006/015386 dated Oct. 24, 2006.
Besser et al., "Mechanical Strain Evolution in Cu/low K Interconnect Lines", *Mat. Res. Soc. Symp. Proc.* vol. 795, 2004 Materials Research Society, pp. U1.1.1-U1.1.6.
Chandrasekaran, et al., "Effects of CMP Process Conditions on Defect Generation in Low-k Materials", *Journal of The Electrochemical Society*, pp. G882-G889 (2004).
Chang, et al., "Microleveling Mechanisms and Applications of Electropolishing of Planarization of Copper Mettalization", *J. Vac. Sci. Technol. B* 20(5), Sep./Oct. 2002, pp. 2149-2152.
Chang, et al., "Superpolishing of Planarizing Copper Damascene Interconnections", *Electrochemical and Solid-State Letters*, pp. G72-G74 (2003).
Contolini, et al., "Electrochemical Planarization for Multilevel Metallization", *J. Electrochem. Soc.*, vol. 141, No. 9, Sep. 1994, pp. 2503-2510.
D. Landolt, "Fundamental Aspects of Electropolishing", Mar. 18, 1996, pp. 1-11.
Deshpande, et al., "Chemical Mechanical Planarization of Copper: Role of Oxidants and Inhibitors", *Journal of The Electrochemical Society*, pp. G788-G794 (2004).
Du, et al., "Effect of Hydrogen Peroxide on Oxidation of Copper in CMP Slurries Containing Glycine and Cu Ions", *Electrochimica Acta*, pp. 4505-4512 (2004).
Du, et al., Mechanism of Copper Removal During CMP in Acidic H2O2 Slurry, *Journal of The Electrochemical Society*, pp. G230-235 (2004).
Economikos, et al., "Integrated Electro-Chemical Mechanical Planarization (Ecmp) for Future Generation Device Technology", 2004 IEEE, pp. 233-235.
Goonetilleke, et al., Voltage-Induced Material Removal for Electrochemical Mechanical Planarization of Copper in Electrolytes Containing NO -3, Glycine, and H2O2, *Electrochemical and Solid-State Letters*, pp. G190-G193 (2005).
Hu, et al. "Copper Interconnection Integration and Reliability", *Thin Solid State Films*, pp. 84-92, (1995).
International Search Report for PCT/US02/04806 dated Apr. 1, 2003.
Jin-Hua, et al., "An XPS and BAW Sensor Study of the Structure and Real-Time Growth Behavious of a Complex Surface Film on Copper in Sodium Chloride Solutions (pH=9), Containing a Low Concentration of Benzotriazole", *Eletrochimica Acta*, vol. 43, Nos. 3-4, pp. 265-274, 1998.
Kaufman, et al., "Chemical-Mechanical Polishing for Fabricating Patterned W Metal Features as Chip Interconnects", *J. Electrochem. Soc.*, vol. 138, No. 11, Nov. 1991; The Electrochemical Society, Inc. pp. 3460-3465.
Kondo, et al., "Role of Additives for Copper Damascene Electrodeposition: Experimental Sudy on Inhibition and Acceleration Effects", *Journal of The Electrochemical Society*, pp. C250-C255 (2004).
Mansikkamaki, et al., "Inhibitive Effect of Benzotriazole on Copper Surfaces Studied by SECM", *Journal of the Electrochemical Society*, pp. B12-B16 (2005).
Nogami, "*An Innovation to Integrate Porous Low-K Materials and Copper*", InterConnect Japan 2001; Honeywell Seminar (Dec. 6, 2001) pp. 1-12.
Padhi, et al., "Planarization of Copper Thin Films by Electropolishing in Phosphoric Acid for ULSI Applications", *Journal of the Electrochemical Society*, 150, pp. G10-G14 (2003).
Partial International Search Report for PCT/US02/40754 dated Apr. 28, 2003.
PCT International Preliminary Examination Report for PCT/US02/04806, dated Sep. 7, 2004.
PCT International Preliminary Examination Report for PCT/US03/06058, dated Sep. 7, 2004.
PCT International Search Report for PCT/US04/17691, dated Nov. 16, 2004.
PCT International Search Report for PCT/US03/06058 dated Jun. 25, 2003.
PCT Written Opinion for PCT/US02/04806, dated Mar. 9, 2004.

PCT Written Opinion for PCT/US03/06058, dated Feb. 13, 2004.
PCT Written Opinion for PCT/US04/17691, dated Nov. 16, 2004.
Qafsaoui, et al., "Quantitative Characterization of Protective Films Grown on Copper in the Presence of Different Triazole Derivative Inhibitors", *Electrochimica Acta 47* (2002), pp. 4339-4346.
Robert J. Contolini, "Electrochemical Planarization of ULSI Copper" Jun. 1997, Solid State Technology, pp. 155-156, 158 and 160.
Steigerwald, et al., "Effect of Copper Ions in the Slurry on the Chemical-Mechanical Polish Rate of Titanium", *J. Electrochem. Soc.*, vol. 141. No. 12, Dec. 1994, pp. 3512-3516.
Tamilmani, et al., "Potential-pH Diagrams of Interest to Chemical Mechanical Planarization of Copper", *Journal of The Electrochemical Society*, V. 149, pp. G638-G642 (2002).
Tromans, et al., "Growth of Passivating CuBTA Films on Copper in Aqueous Chloride/Benzotriazole Solutions", *Electrochemical and Solid-State Letter*, V. 5, pp. B5-B8 (2002).
Wang, et al., "Inhibition Effect of AC-Treated, Mixed Self-Assembled Film of Phenylthiourea and 1-Dodecanethiol on Copper Corrosion", *Journal of The Electrochemical Society*, pp. B11-B15 (2004).

\* cited by examiner

*Primary Examiner*—Lan Vinh
*Assistant Examiner*—Maki Angadi
(74) *Attorney, Agent, or Firm*—Paterson & Sheridan

(57) ABSTRACT

Polishing compositions and methods for removing conductive materials from a substrate surface are provided. In one aspect, a method is provided for processing a substrate to remove conductive material disposed over narrow feature definitions formed in a substrate at a higher removal rate than conductive material disposed over wide feature definitions formed in a substrate by an electrochemical mechanical polishing technique, and then polishing the substrate by at least a chemical mechanical polishing technique.

20 Claims, 8 Drawing Sheets

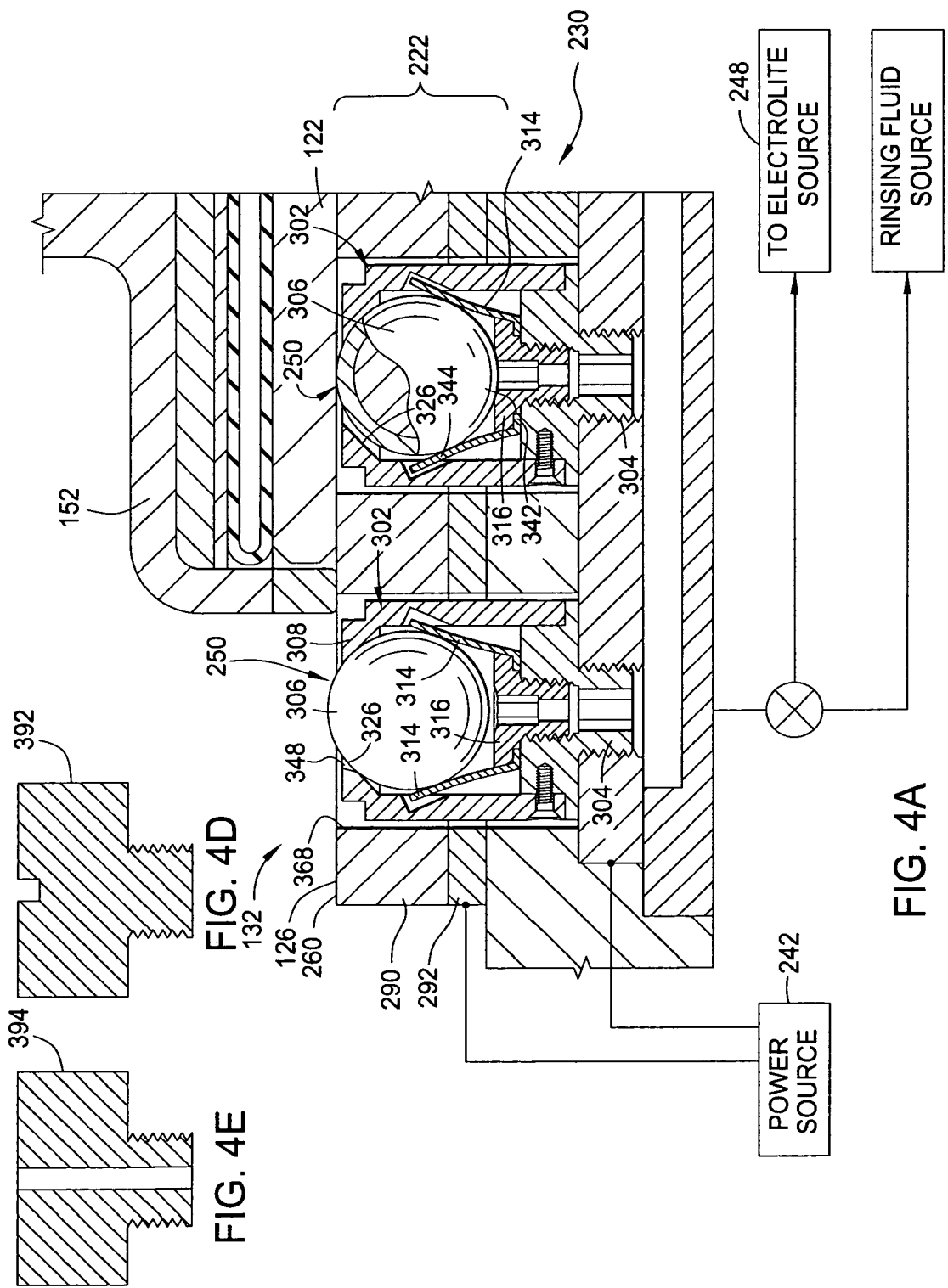

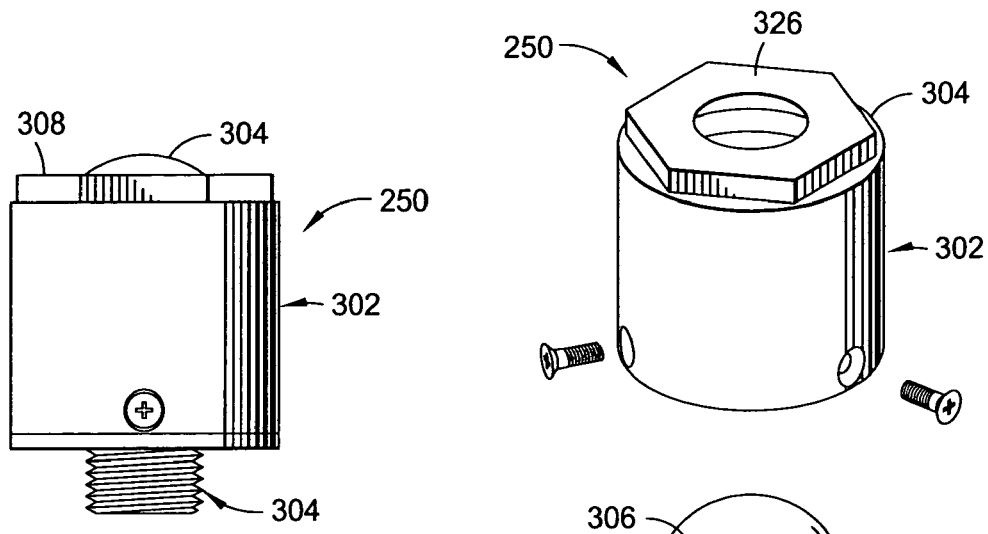
FIG. 5A
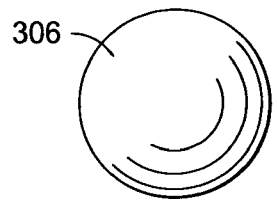
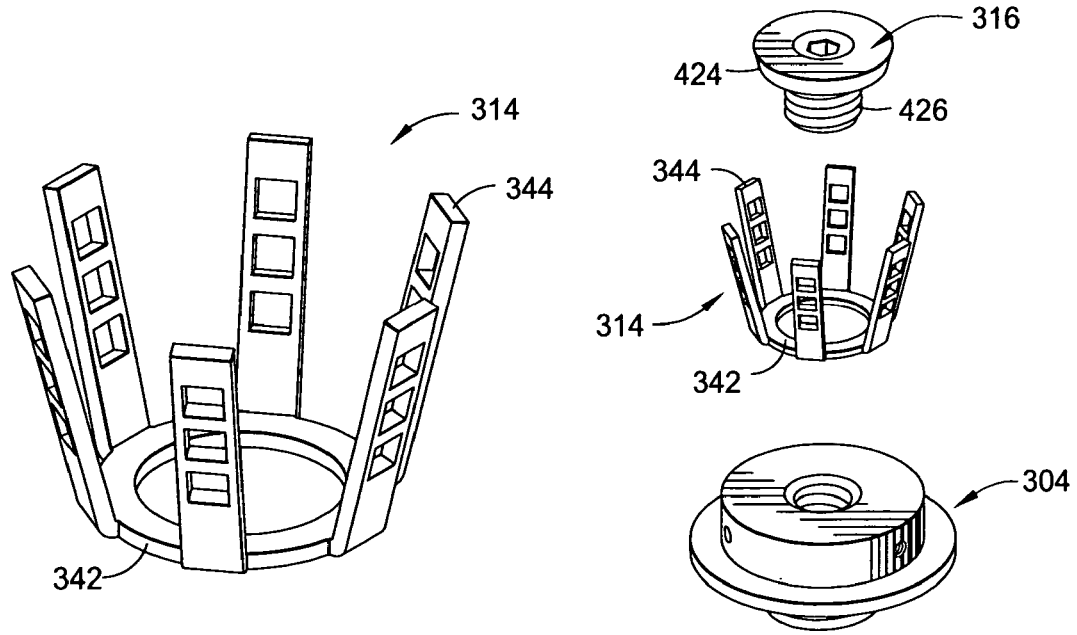
FIG. 6
FIG. 5B

METHOD AND COMPOSITION FOR POLISHING A SUBSTRATE

CROSS-REFERENCE TO RELATED APPLICATIONS

This application is a continuation-in-part co-pending U.S. patent application Ser. No. 11/123,274, filed May 5, 2005, which application is a continuation-in-part of co-pending U.S. patent application Ser. No. 10/845,754, filed May 14, 2004, which application is a continuation-in-part of co-pending U.S. patent application Ser. No. 10/456,220, filed Jun. 6, 2003, which application is a continuation-in-part of U.S. patent application Ser. No. 10/378,097, filed Feb. 26, 2003, now U.S. Pat. No. 7,128,825 which application claims priority to the U.S. Provisional Patent Application Ser. No. 60/359,746, filed on Feb. 26, 2002, and which U.S. patent application Ser. No. 10/378,097 is a continuation-in-part of U.S. patent application Ser. No. 10/038,066, filed Jan. 3, 2002, now U.S. Pat. No. 6,811,680, issued on Nov. 2, 2004, which application claims priority to the U.S. Provisional Patent Application Ser. No. 60/275,874, filed on Mar. 14, 2001; and this application is a continuation-in-part co-pending U.S. patent application Ser. No. 11/074,274, filed Mar. 7, 2005, which application is a continuation application of U.S. patent application Ser. No. 10/141,459, filed May 7, 2002, now U.S. Pat. No. 6,863,797, issued on Mar. 8, 2005, which application is a continuation-in-part of U.S. patent application Ser. No. 10/032,275, filed Dec. 21, 2001 now U.S. Pat. No. 6,899,804; and this application is a continuation-in-part of co-pending U.S. patent application Ser. No. 10/608,404, filed Jun. 26, 2003, which application is a continuation-in-part of U.S. patent application Ser. No. 10/038,066, filed Jan. 3, 2002, now U.S. Pat. No. 6,811,680 that claims priority to U.S. Provisional Patent Application Ser. No. 60/275,874, filed on Mar. 14, 2001, and a continuation-in-part of U.S. patent application Ser. No. 10/032,275, filed Dec. 21, 2001, now U.S. Pat. No. 6,899,804 which applications are incorporated by reference herein.

BACKGROUND OF THE INVENTION

1. Field of the Invention

Embodiments of the present invention relate to compositions and methods for removing a conductive material from a substrate.

2. Background of the Related Art

Reliably producing sub-half micron and smaller features is one of the key technologies for the next generation of very large scale integration (VLSI) and ultra large-scale integration (ULSI) of semiconductor devices. However, as the limits of circuit technology are pushed, the shrinking dimensions of interconnects in VLSI and ULSI technology have placed additional demands on processing capabilities. Reliable formation of interconnects is important to VLSI and ULSI success and to the continued effort to increase circuit density and quality of individual substrates and die.

Multilevel interconnects are formed using sequential material deposition and material removal techniques on a substrate surface to form features therein. As layers of materials are sequentially deposited and removed, the uppermost surface of the substrate may become non-planar across its surface and require planarization prior to further processing. Planarization or "polishing" is a process where material is removed from the surface of the substrate to form a generally even, planar surface. Planarization is useful in removing excess deposited material, removing undesired surface topography, and surface defects, such as surface roughness, agglomerated materials, crystal lattice damage, scratches, and contaminated layers or materials to provide an even surface for subsequent photolithography and other semiconductor processes.

Chemical mechanical planarization, or chemical mechanical polishing (CMP), is a common technique used to planarize substrates. In conventional CMP techniques, a substrate carrier or polishing head is mounted on a carrier assembly and positioned in contact with a polishing article in a CMP apparatus. The carrier assembly provides a controllable pressure to the substrate urging the substrate against the polishing article. The article is moved relative to the substrate by an external driving force. Thus, the CMP apparatus effects polishing or rubbing movement between the surface of the substrate and the polishing article while dispersing a polishing composition to effect both chemical activity and mechanical activity.

However, materials deposited on the surface of a substrate to fill feature definitions formed therein often result in unevenly formed surfaces over feature definitions of variable density. Referring to FIG. 1A, a metal layer 20 is deposited on a substrate 10 to fill wide feature definitions 30, also known as low density feature definitions, or narrow feature definitions 40, also known as and high density feature definitions. Excess material, called overburden, may be formed with a greater thickness 45 over the narrow feature definitions 40 and may have minimal deposition 35 over wide feature definitions 30. Polishing of surfaces with overburden may result in the retention of residues 50 from inadequate metal removal over narrow features. Overpolishing processes to remove such residues 50 may result in excess metal removal over wide feature definitions 30. Excess metal removal can form topographical defects, such as concavities or depressions known as dishing 55, over wide features, as shown in FIG. 1B.

Dishing of features and retention of residues on the substrate surface are undesirable since dishing and residues may detrimentally affect subsequent processing of the substrate. For example, dishing results in a non-planar surface that impairs the ability to print high-resolution lines during subsequent photolithographic steps and detrimentally affects subsequent surface topography of the substrate, which affects device formation and yields. Dishing also detrimentally affects the performance of devices by lowering the conductance and increasing the resistance of the devices, causing device variability and device yield loss. Residues may lead to uneven polishing of subsequent materials, such as barrier layer materials (not shown) disposed between the conductive material and the substrate surface. Post CMP profiles generally show higher dishing on wide trenches than on narrow trenches or dense areas. Uneven polishing will also increase defect formation in devices and reduce substrate yields.

Therefore, there is a need for compositions and methods for removing conductive material from a substrate that minimizes damage to the substrate during planarization.

SUMMARY OF THE INVENTION

Embodiments of the invention provide compositions and methods for removing conductive materials by an electrochemical mechanical polishing technique. In one aspect, a method is provided for processing a substrate having a barrier material layer disposed over narrow feature definitions and wide feature definitions and a conductive material layer disposed on the barrier material layer, comprising polishing the conductive material layer by an electrochemical mechanical polishing process to remove bulk conductive material, forming a protrusion in residual conductive material disposed over wide feature definitions, polishing the residual conductive material by at least a chemical mechanical polishing technique to expose the underlying barrier material layer and polishing the barrier material layer by at least a chemical mechanical polishing technique.

In another aspect, a method is provided for processing a substrate having a conductive material layer disposed thereon over narrow feature definitions and wide feature definitions including removing conductive material disposed over narrow feature definitions at a higher removal rate than conductive material disposed over wide feature definitions by a first electrochemical mechanical polishing technique and removing conductive material disposed over wide feature definitions at a removal rate greater than or equal to the removal rate of conductive material disposed over narrow feature definitions by a second electrochemical mechanical polishing technique.

In another aspect, a method is provided for processing a substrate having a conductive material layer disposed thereon including providing the substrate to a process apparatus comprising a first polishing article coupled to a first electrode and a second electrode, wherein the substrate surface comprises a barrier material layer disposed over narrow feature definitions and wide feature definitions and a conductive material layer disposed on the barrier material layer, contacting the substrate with the first polishing article, supplying a first polishing composition between the substrate and the first polishing article, applying a bias between the first electrode and the second electrode, removing conductive material disposed over narrow feature definitions at a higher removal rate than conductive material disposed over wide feature definitions to form a protrusion, and then providing the substrate to a process apparatus comprising a second polishing article, contacting the substrate with the second polishing article, supplying a second polishing composition between the substrate and the second polishing article, removing conductive material disposed over narrow feature definitions at a lower removal rate than conductive material disposed over wide feature definitions.

BRIEF DESCRIPTION OF THE DRAWINGS

So that the manner in which the above recited aspects of the present invention are attained and can be understood in detail, a more particular description of embodiments of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 4A is a partial sectional view of the first Ecmp station through two contact assemblies;

FIGS. 4D-E are sectional views of plugs;

FIGS. 5A and 5B are side, exploded and sectional views of one embodiment of a contact assembly;

FIG. 6 is one embodiment of a contact element;

DETAILED DESCRIPTION OF THE PREFERRED EMBODIMENT

In general, aspects of the invention provide compositions and methods for removing at least a conductive material from a substrate surface. The invention is described below in reference to a planarizing process for the removal of conductive materials from a substrate surface by electrochemical mechanical polishing (Ecmp) techniques and/or chemical mechanical polishing (CMP) techniques.

The words and phrases used herein should be given their ordinary and customary meaning in the art by one skilled in the art unless otherwise further defined. Chemical mechanical polishing (CMP) should be broadly construed and includes, but is not limited to, planarizing a substrate surface using chemical activity and mechanical activity, or a concurrent application of chemical activity and mechanical activity. Electropolishing (EP) should be broadly construed and includes, but is not limited to, planarizing a substrate by the application of electrochemical activity. Electrochemical mechanical polishing (Ecmp) should be broadly construed and includes, but is not limited to, planarizing a substrate by the application of electrochemical activity, mechanical activity, chemical activity, or a concurrent application of a combination of electrochemical, chemical, and/or mechanical activity to remove material from a substrate surface.

Anodic dissolution should be broadly construed and includes, but is not limited to, the application of an anodic bias to a substrate directly or indirectly which results in the removal of conductive material from a substrate surface and into a surrounding polishing composition. Polishing composition should be broadly construed and includes, but is not limited to, a composition that provides ionic conductivity, and thus, electrical conductivity, in a liquid medium, which generally comprises materials known as electrolyte components. The amount of each electrolyte component in polishing compositions can be measured in volume percent or weight percent. Volume percent refers to a percentage based on volume of a desired liquid component divided by the total volume of all of the liquid in the complete composition. A percentage based on weight percent is the weight of the desired component divided by the total weight of all of the liquid components in the complete composition. Abrading and abrasion should be broadly construed and includes, but is not limited to, contacting a material and displacing, disturbing, or removing all or a portion of a material.

One Apparatus Embodiment

Figure 1A:
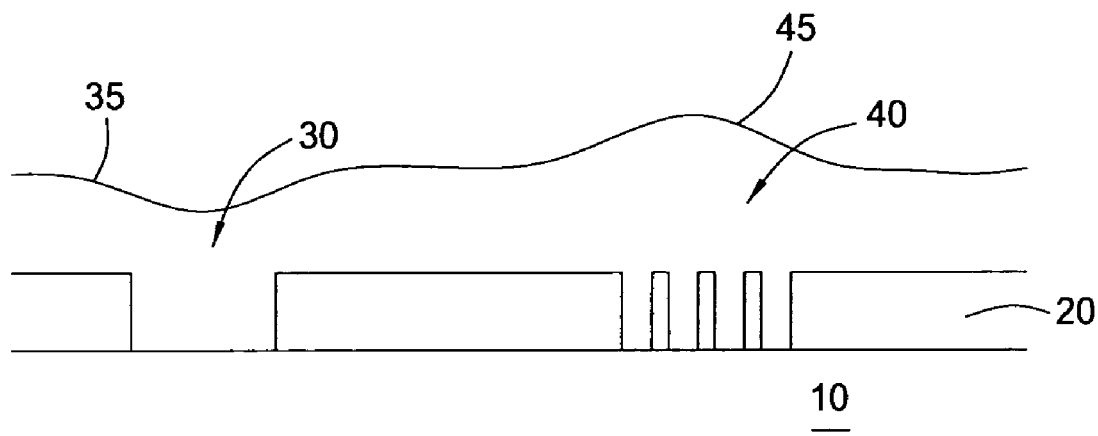
FIGS. 1A and 1B schematically illustrate a polishing process performed on a substrate according to conventional processes.
Figure 1B:
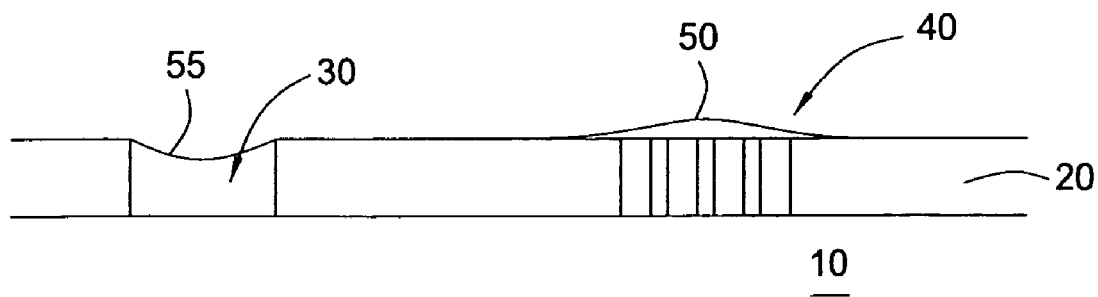
Figure 2:
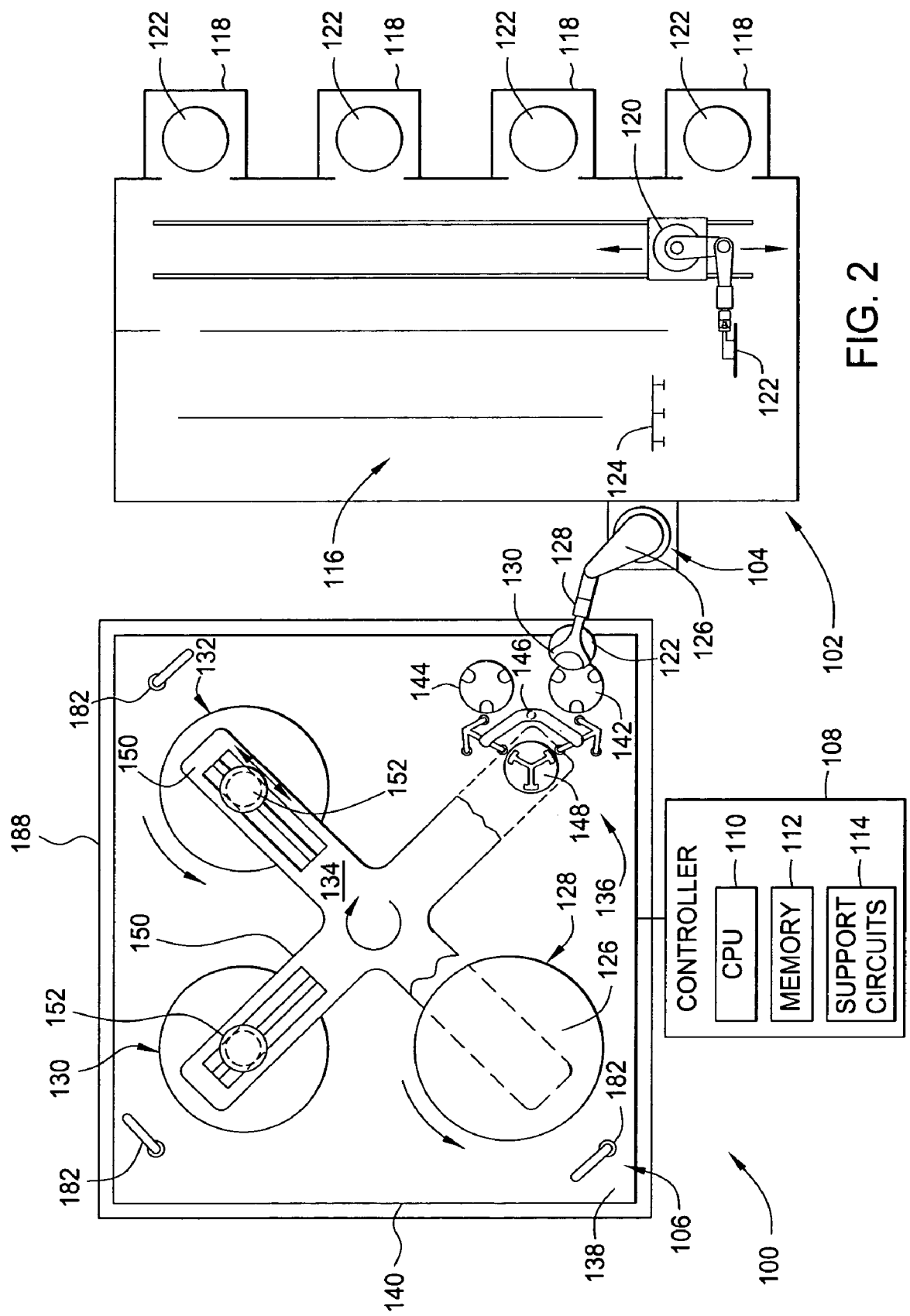
FIG. 2 is a plan view of an electrochemical mechanical planarizing system.

FIG. 2 is a plan view of one embodiment of a planarization system 100 having an apparatus for electrochemically processing a substrate. The exemplary system 100 generally comprises a factory interface 102, a loading robot 104, and a planarizing module 106. The loading robot 104 is disposed proximate the factory interface 102 and the planarizing module 106 to facilitate the transfer of substrates 122 therebetween.

A controller 108 is provided to facilitate control and integration of the modules of the system 100. The controller 108 comprises a central processing unit (CPU) 110, a memory 112, and support circuits 114. The controller 108 is coupled to the various components of the system 100 to facilitate control of, for example, the planarizing, cleaning, and transfer processes.

The factory interface 102 generally includes a cleaning module 116 and one or more wafer cassettes 118. An interface robot 120 is employed to transfer substrates 122 between the wafer cassettes 118, the cleaning module 116 and an input module 124. The input module 124 is positioned to facilitate transfer of substrates 122 between the planarizing module 106 and the factory interface 102 by grippers, for example vacuum grippers or mechanical clamps (not shown).

The planarizing module 106 includes at least one polishing station 128, disposed in an environmentally controlled enclosure 188. Examples of planarizing modules 106 that can be adapted to benefit from the invention include MIRRA® Chemical Mechanical Planarizing Systems, MIRRA MESA™ Chemical Mechanical Planarizing Systems, REFLEXION® Chemical Mechanical Planarizing Systems, REFLEXION® LK Chemical Mechanical Planarizing Systems, and REFLEXION LK Ecmp™ Chemical Mechanical Planarizing Systems, all available from Applied Materials, Inc. of Santa Clara, Calif. Other planarizing modules, including those that use processing articles, planarizing webs, or a combination thereof, and those that move a substrate relative to a planarizing surface in a rotational, linear or other planar motion may also be adapted to benefit from the invention.

In the embodiment depicted in FIG. 2, the planarizing module 106 includes three polishing stations 128, 130, and 132, with each station 128, 130, and 132, may be chemical mechanical polishing (CMP) station or an electrochemical polishing (Ecmp) station, respectively. The Ecmp stations may be of the conductive element polishing article Ecmp stations as described in FIG. 3, or a fully conductive article Ecmp station as described in FIG. 7. As CMP stations are conventional in nature, further description thereof has been omitted for the sake of brevity. However, an example of a suitable CMP polishing station is more fully described in U.S. Pat. No. 5,738,574, issued on Apr. 14, 1998, entitled, "Continuous Processing System for Chemical Mechanical Polishing," the entirety of which is incorporated herein by reference to the extent not inconsistent with the invention.

The exemplary planarizing module 106 also includes a transfer station 136 and a carousel 134 that are disposed on an upper or first side 138 of a machine base 140. In one embodiment, the transfer station 136 includes an input buffer station 142, an output buffer station 144, a transfer robot 146, and a load cup assembly 148. The input buffer station 142 receives substrates from the factory interface 102 by means of the loading robot 104. The loading robot 104 is also utilized to return polished substrates from the output buffer station 144 to the factory interface 102. The transfer robot 146 is utilized to move substrates between the buffer stations 142, 144 and the load cup assembly 148.

In one embodiment, the transfer robot 146 includes two gripper assemblies (not shown), each having pneumatic gripper fingers that hold the substrate by the substrate's edge. The transfer robot 146 may simultaneously transfer a substrate to be processed from the input buffer station 142 to the load cup assembly 148 while transferring a processed substrate from the load cup assembly 148 to the output buffer station 144. An example of a transfer station that may be used to advantage is described in U.S. Pat. No. 6,156,124, issued Dec. 5, 2000 to Tobin, which is herein incorporated by reference in its entirety.

The carousel 134 is centrally disposed on the machine base 140. The carousel 134 typically includes a plurality of arms 150, each supporting a planarizing head assembly 152. Two of the arms 150 depicted in FIG. 2 are shown in phantom such that the transfer station 136 and a planarizing surface 126 of the first polishing station 128 may be seen. The carousel 134 is indexable such that the planarizing head assembly 152 may be moved between the planarizing stations 128, 130, 132 and the transfer station 136. One carousel that may be utilized to advantage is described in U.S. Pat. No. 5,804,507, issued Sep. 8, 1998 to Perlov, et al., which is hereby incorporated by reference in its entirety.

A conditioning device 182 is disposed on the machine base 140 adjacent each of the planarizing stations 128, 130, 132. The conditioning device 182 periodically conditions the planarizing material disposed in the stations 128, 130, 132 to maintain uniform planarizing results.

Figure 3:
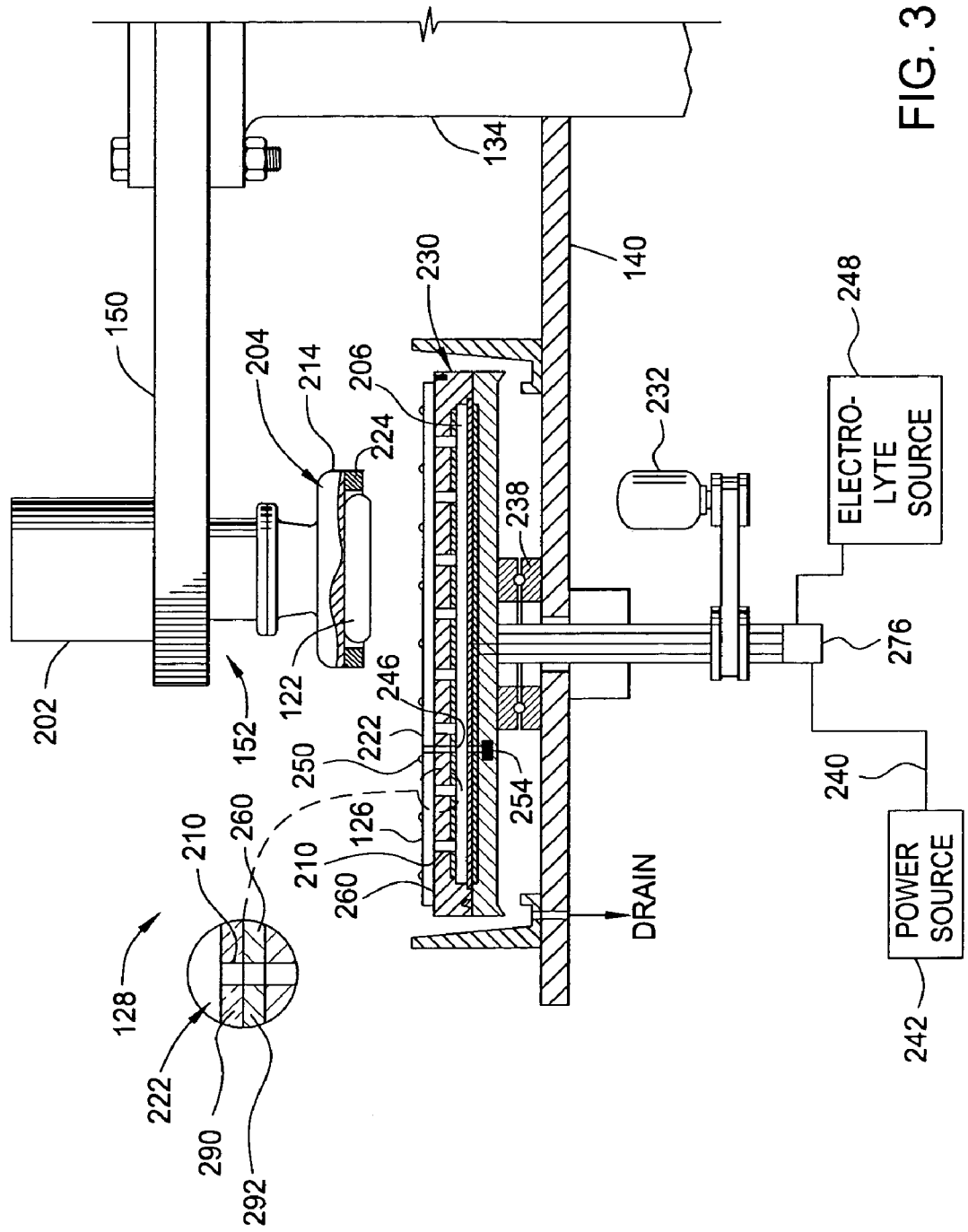
FIG. 3 is a sectional view of one embodiment of a first electrochemical mechanical planarizing (Ecmp) station of the system of FIG. 2.

FIG. 3 depicts a sectional view of one of the planarizing head assembly 152 positioned over one embodiment of the polishing station 128. The planarizing head assembly 152 generally comprises a drive system 202 coupled to a planarizing head 204. The drive system 202 generally provides at least rotational motion to the planarizing head 204. The planarizing head 204 additionally may be actuated toward the polishing station 128 such that the substrate 122 retained in the planarizing head 204 may be disposed against the planarizing surface 126 of the polishing station 128 during processing. The drive system 202 is coupled to the controller 108 that provides a signal to the drive system 202 for controlling the rotational speed and direction of the planarizing head 204.

In one embodiment, the planarizing head may be a TITAN HEAD™ or TITAN PROFILER™ wafer carrier manufactured by Applied Materials, Inc. Generally, the planarizing head 204 comprises a housing 214 and retaining ring 224 that defines a center recess in which the substrate 122 is retained. The retaining ring 224 circumscribes the substrate 122 disposed within the planarizing head 204 to prevent the substrate from slipping out from under the planarizing head 204 while processing. The retaining ring 224 can be made of plastic materials such as polyphenylene sulfide (PPS), polyetheretherketone (PEEK), and the like, or conductive materials such as stainless steel, Cu, Au, Pd, and the like, or some combination thereof. It is further contemplated that a conductive retaining ring 224 may be electrically biased to control the electric field during Ecmp. Conductive or biased retaining rings tend to slow the polishing rate proximate the edge of the substrate. It is contemplated that other planarizing heads may be utilized.

The polishing station 128 generally includes a platen assembly 230 that is rotationally disposed on the machine base 140. The platen assembly 230 is supported above the machine base 140 by a bearing 238 so that the platen assembly 230 may be rotated relative to the machine base 140. An area of the machine base 140 circumscribed by the bearing 238 is open and provides a conduit for the electrical, mechanical, pneumatic, control signals and connections communicating with the platen assembly 230.

Conventional bearings, rotary unions and slip rings, collectively referred to as rotary coupler 276, are provided such that electrical, mechanical, fluid, pneumatic, control signals and connections may be coupled between the machine base 140 and the rotating platen assembly 230. The platen assembly 230 is typically coupled to a motor 232 that provides the rotational motion to the platen assembly 230. The motor 232 is coupled to the controller 108 that provides a signal for controlling for the rotational speed and direction of the platen assembly 230.

A top surface 260 of the platen assembly 230 supports a polishing article assembly 222 thereon. The processing article assembly may be retained to the platen assembly 230 by magnetic attraction, vacuum, clamps, adhesives and the like.

A plenum 206 is defined in the platen assembly 230 to facilitate uniform distribution of electrolyte to the planarizing surface 126. A plurality of passages, described in greater detail below, are formed in the platen assembly 230 to allow electrolyte, provided to the plenum 206 from an electrolyte source 248, to flow uniformly though the platen assembly 230 and into contact with the substrate 122 during processing. It is contemplated that different electrolyte compositions may be provided during different stages of processing.

The polishing article assembly 222 includes an electrode 292 and at least a planarizing portion 290. The electrode 292 is typically comprised of a conductive material, such as stainless steel, copper, aluminum, gold, silver and tungsten, among others. The electrode 292 may be solid, impermeable to electrolyte, permeable to electrolyte or perforated. At least one contact assembly 250 extends above the polishing article assembly 222 and is adapted to electrically couple the substrate being processed on the polishing article assembly 222 to the power source 224. The electrode 292 is also coupled to the power source 224 so that an electrical potential may be established between the substrate and electrode 292.

A meter (not shown) is provided to detect a metric indicative of the electrochemical process. The meter may be coupled or positioned between the power source 224 and at least one of the electrode 292 or contact assembly 250. The meter may also be integral to the power source 224. In one embodiment, the meter is configured to provide the controller 108 with a metric indicative of processing, such a charge, current and/or voltage. This metric may be utilized by the controller 108 to adjust the processing parameters in-situ or to facilitate endpoint or other process stage detection.

A window 246 is provided through the polishing article assembly 222 and/or platen assembly 230, and is configured to allow a sensor 254, positioned below the polishing article assembly 222, to sense a metric indicative of polishing performance. For example, the sensor 704 may be an eddy current sensor or an interferometer, among other sensors. The metric, provided by the sensor 254 to the controller 108, provides information that may be utilized for processing profile adjustment in-situ, endpoint detection or detection of another point in the electrochemical process. In one embodiment, the sensor 254 an interferometer capable of generating a collimated light beam, which during processing, is directed at and impinges on a side of the substrate 122 that is being polished. The interference between reflected signals is indicative of the thickness of the conductive layer of material being processed. One sensor that may be utilized to advantage is described in U.S. Pat. No. 5,893,796, issued Apr. 13, 1999, to Birang, et al, which is hereby incorporated by reference in its entirety.

Embodiments of the polishing article assembly 222 suitable for removal of conductive material from the substrate 122 may generally include a planarizing surface 126 that is substantially dielectric. Other embodiments of the polishing article assembly 222 suitable for removal of conductive material from the substrate 122 may generally include a planarizing surface 126 that is substantially conductive. At least one contact assembly 250 is provided to couple the substrate to the power source 224 so that the substrate may be biased relative to the electrode 292 during processing. Apertures 210, formed through the planarizing layer 290 and the electrode 292 and the any elements disposed below the electrode, allow the electrolyte to establish a conductive path between the substrate 122 and electrode 292.

In one embodiment, the planarizing portion 290 of the polishing article assembly 222 is a dielectric, such as polyurethane. Examples of processing article assemblies that may be adapted to benefit from the invention are described in U.S. patent application Ser. No. 10/455,941, filed Jun. 6, 2003, entitled "Conductive Planarizing Article For Electrochemical Mechanical Planarizing," and U.S. patent application Ser. No. 10/455,895, filed Jun. 6, 2003, entitled "Conductive Planarizing Article For Electrochemical Mechanical Planarizing," both of which are hereby incorporated by reference in their entireties.

Figure 4B:
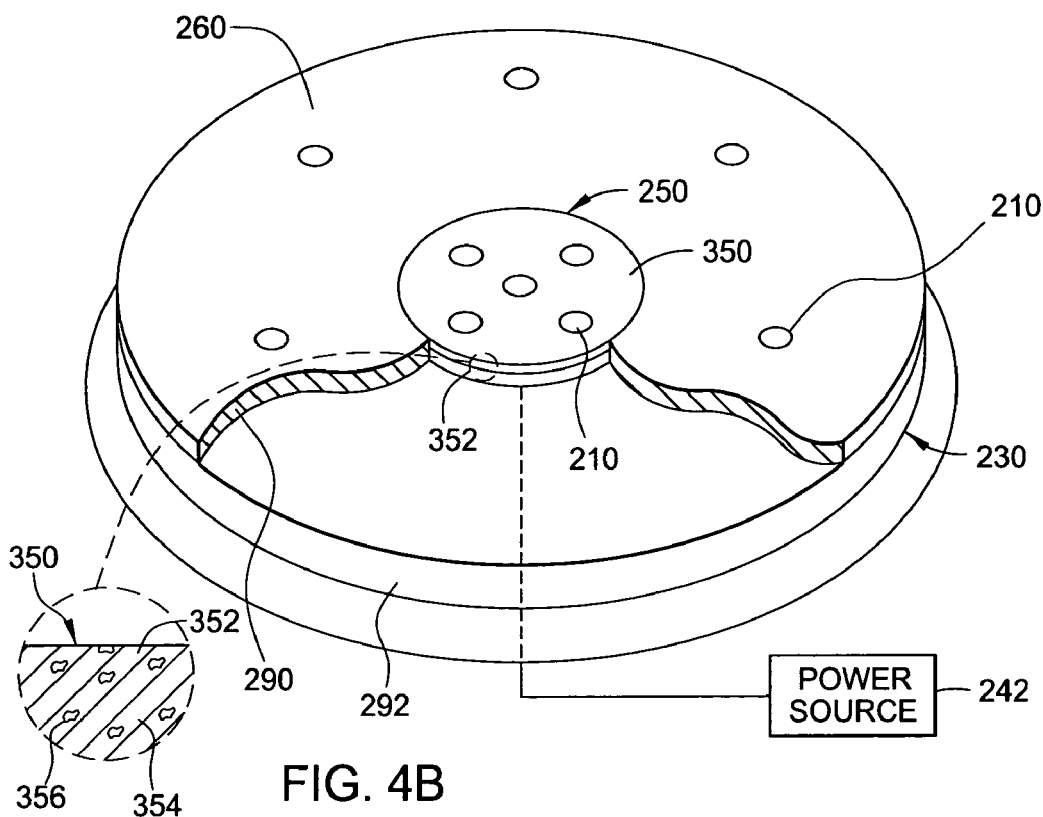
FIGS. 4B-C are sectional views of alternative embodiments of contact assemblies.
Figure 4C:
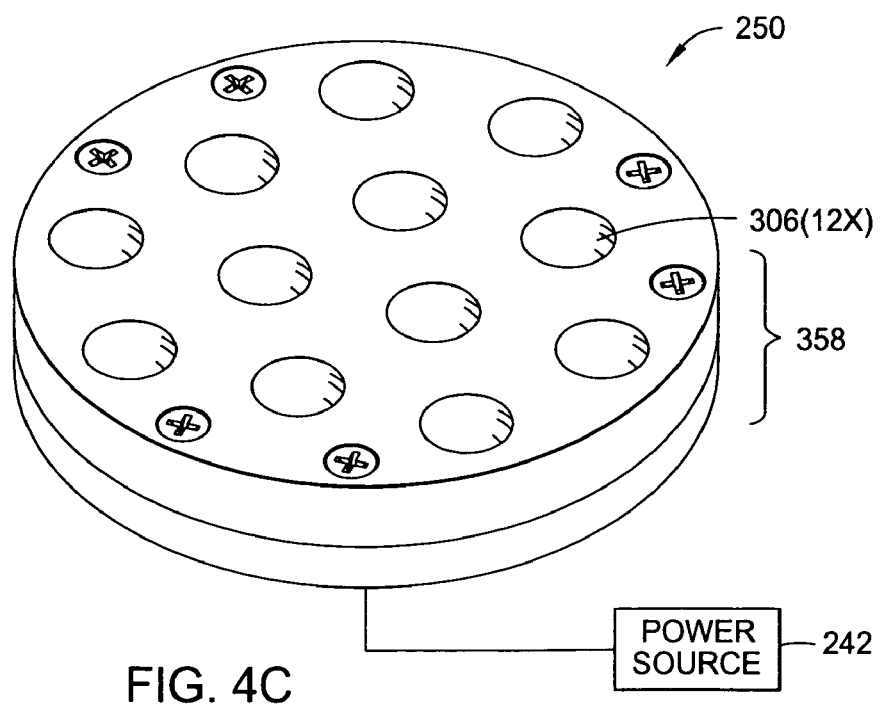

FIG. 4A is a partial sectional view of a first Ecmp station that may be used for polishing station 128 through two contact assemblies 250, and FIGS. 5A-C are side, exploded and sectional views of one of the contact assemblies 250 shown in FIG. 5A. The platen assembly 230 includes at least one contact assembly 250 projecting therefrom and coupled to the power source 224 that is adapted to bias a surface of the substrate 122 during processing. The contact assemblies 250 may be coupled to the platen assembly 230, part of the polishing article assembly 222, or a separate element. Although two contact assemblies 250 are shown in FIG. 3A, any number of contact assemblies may be utilized and may be distributed in any number of configurations relative to the centerline of the platen assembly 230.

The contact assemblies 250 are generally electrically coupled to the power source 224 through the platen assembly 230 and are movable to extend at least partially through respective apertures 368 formed in the polishing article assembly 222. The positions of the contact assemblies 250 may be chosen to have a predetermined configuration across the platen assembly 230. For predefined processes, individual contact assemblies 250 may be repositioned in different apertures 368, while apertures not containing contact assemblies may be plugged with a stopper 392 or filled with a nozzle 394 (as shown in FIGS. 4D-E) that allows flow of electrolyte from the plenum 206 to the substrate. One contact assembly that may be adapted to benefit from the invention is described in U.S. patent application Ser. No. 6,884,153, issued on May 26, 2005, by Butterfield, et al., and is hereby incorporated by reference in its entirety.

Although the embodiments of the contact assembly 250 described below with respect to FIG. 3A depicts a rolling ball contact, the contact assembly 250 may alternatively comprise a structure or assembly having a conductive upper layer or surface suitable for electrically biasing the substrate 122 during processing. For example, as depicted in FIG. 3B, the contact assembly 250 may include a article structure 350 having an upper layer 352 made from a conductive material or a conductive composite (i.e., the conductive elements are dispersed integrally with or comprise the material comprising the upper surface), such as a polymer matrix 354 having conductive particles 356 dispersed therein or a conductive coated fabric, among others. The article structure 350 may include one or more of the apertures 210 formed therethrough for electrolyte delivery to the upper surface of the article assembly. Other examples of suitable contact assemblies are described in U.S. patent application Ser. No. 10/980,888, filed Nov. 3, 2004, by Hu, et al, which is hereby incorporated by reference in its entirety.

In one embodiment, each of the contact assemblies 250 includes a hollow housing 302, an adapter 304, a ball 306, a contact element 314 and a clamp bushing 316. The ball 306 has a conductive outer surface and is movably disposed in the housing 302. The ball 306 may be disposed in a first position having at least a portion of the ball 306 extending above the planarizing surface 126 and at least a second position where the ball 306 is substantially flush with the planarizing surface 126. It is also contemplated that the ball 306 may move completely below the planarizing surface 126. The ball 306 is generally suitable for electrically coupling the substrate 122 to the power source 224. It is contemplated that a plurality of balls 306 for biasing the substrate may be disposed in a single housing 358 as depicted in FIG. 3C.

The power source 224 generally provides a positive electrical bias to the ball 306 during processing. Between planarizing substrates, the power source 224 may optionally apply a negative bias to the ball 306 to minimize attack on the ball 306 by process chemistries.

The housing 302 is configured to provide a conduit for the flow of electrolyte from the electrolyte source 248 to the substrate 122 during processing. The housing 302 is fabricated from a dielectric material compatible with process chemistries. A seat 326 formed in the housing 302 prevents the ball 306 from passing out of the first end 308 of the housing 302. The seat 326 optionally may include one or more grooves 348 formed therein that allow fluid flow to exit the housing 302 between the ball 306 and seat 326. Maintaining fluid flow past the ball 306 may minimize the propensity of process chemistries to attack the ball 306.

The contact element 314 is coupled between the clamp bushing 316 and the adapter 304. The contact element 314 is generally configured to electrically connect the adapter 304 and ball 306 substantially or completely through the range of ball positions within the housing 302. In one embodiment, the contact element 314 may be configured as a spring form.

In the embodiment depicted in FIGS. 4A-E and 5A-C and detailed in FIG. 6, the contact element 314 includes an annular base 342 having a plurality of flexures 344 extending therefrom in a polar array. The flexure 344 is generally fabricated from a resilient and conductive material suitable for use with process chemistries. In one embodiment, the flexure 344 is fabricated from gold plated beryllium copper.

Returning to FIGS. 4A and 5A-B, the clamp bushing 316 includes a flared head 424 having a threaded post 422 extending therefrom. The clamp bushing 316 may be fabricated from either a dielectric or conductive material, or a combination thereof, and in one embodiment, is fabricated from the same material as the housing 302. The flared head 424 maintains the flexures 344 at an acute angle relative to the centerline of the contact assembly 250 so that the flexures 344 of the contact elements 314 are positioned to spread around the surface of the ball 306 to prevent bending, binding and/or damage to the flexures 344 during assembly of the contact assembly 250 and through the range of motion of the ball 306.

The ball 306 may be solid or hollow and is typically fabricated from a conductive material. For example, the ball 306 may be fabricated from a metal, conductive polymer or a polymeric material filled with conductive material, such as metals, conductive carbon or graphite, among other conductive materials. Alternatively, the ball 306 may be formed from a solid or hollow core that is coated with a conductive material. The core may be non-conductive and at least partially coated with a conductive covering.

The ball 306 is generally actuated toward the planarizing surface 126 by at least one of spring, buoyant or flow forces. In the embodiment depicted in FIG. 5, flow through the passages formed through the adapter 304 and clamp bushing 316 and the platen assembly 230 from the electrolyte source 248 urge the ball 306 into contact with the substrate during processing.

Figure 7:
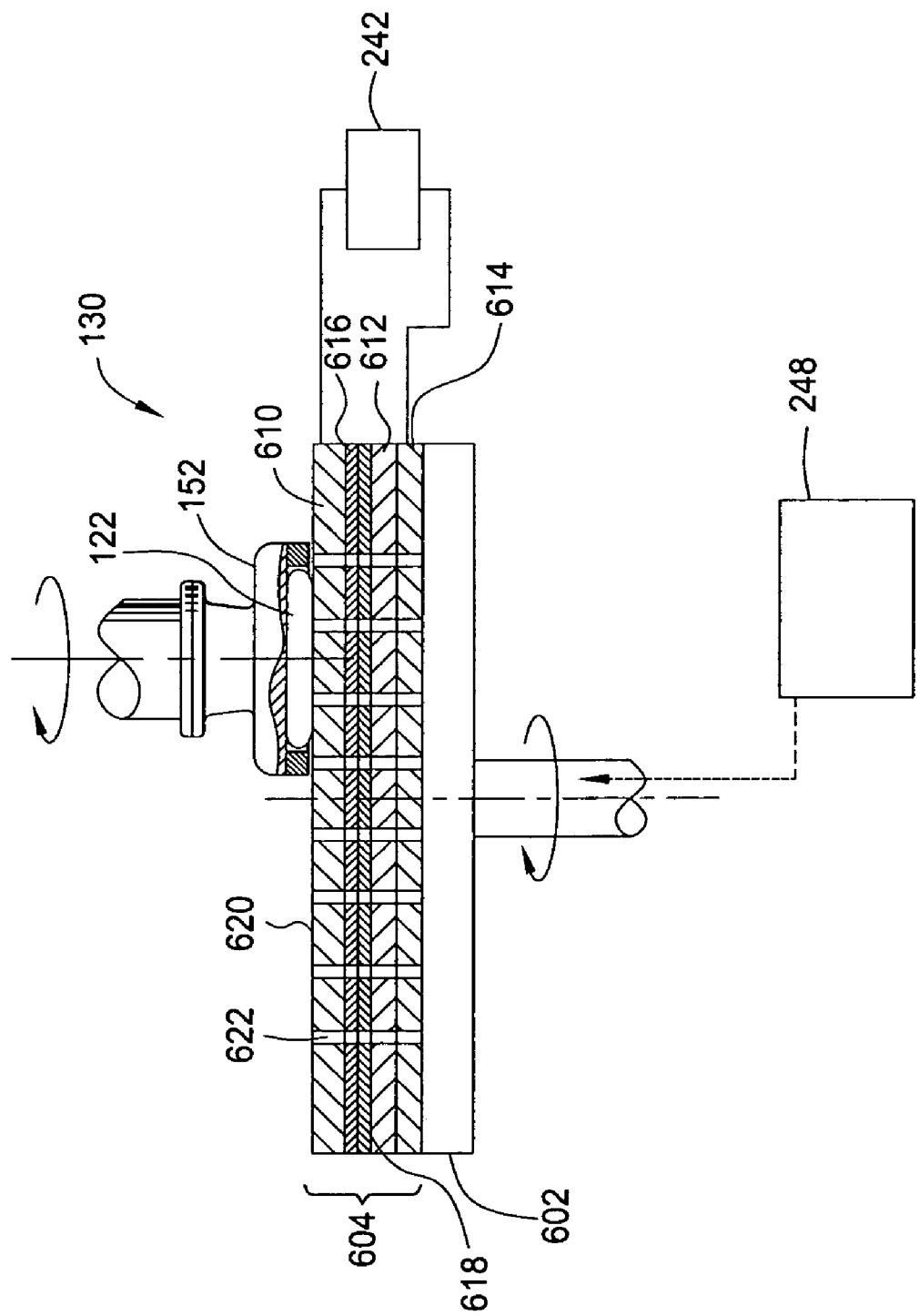
FIG. 7 is a vertical sectional view of another embodiment of an Ecmp station.

FIG. 7 is a sectional view of one embodiment of the second Ecmp station, which may be polishing station 130. The first and third Ecmp stations 128, 132 may be configured similarly. The second Ecmp station generally includes a platen 602 that supports a fully conductive processing article assembly 604. The platen 602 may be configured similar to the platen assembly 230 described above to deliver electrolyte through the processing article assembly 604, or the platen 602 may have a fluid delivery arm (not shown) disposed adjacent thereto configured to supply electrolyte to a planarizing surface of the processing article assembly 604. The platen 602 includes at least one of a meter or sensor 254 (shown in FIG. 3) to facilitate endpoint detection.

In one embodiment, the processing article assembly 604 includes interposed article 612, or interpose pad, sandwiched between a conductive article 610 (i.e., a conductive polishing article) and an electrode 614. The conductive article 610 is substantially conductive across its top processing surface and is generally made from a conductive material or a conductive composite (i.e., the conductive elements are dispersed integrally with or comprise the material comprising the planarizing/polishing surface), such as a polymer matrix having conductive particles dispersed therein or a conductive coated fabric, among others. The conductive article 610, the interposed article 612, and the electrode 614 may be fabricated into a single, replaceable assembly. The processing article assembly 604 is generally permeable or perforated to allow electrolyte to pass between the electrode 614 and top surface 620 of the conductive article 610. In the embodiment depicted in FIG. 7, the processing article assembly 604 is perforated by apertures 622 to allow electrolyte to flow therethrough. In one embodiment, the conductive article 610 is comprised of a conductive material disposed on a polymer matrix disposed on a conductive fiber, for example, tin particles in a polymer matrix disposed on a woven copper coated polymer. The conductive article 610 may also be utilized for the contact assembly 250 in the embodiment of FIG. 3.

A conductive foil 616 may additionally be disposed between the conductive article 610 and the interposed article 612. The foil 616 is coupled to a power source 224 and provides uniform distribution of voltage applied by the source 242 across the conductive article 610. In embodiments not including the conductive foil 616, the conductive article 610 may be coupled directly, for example, via a terminal integral to the conductive article 610, to the power source 224. Additionally, the article assembly 604 may include an interposed article 618, which, along with the foil 616, provides mechanical strength to the overlying conductive article 610. Examples of suitable article assemblies are described in the previously incorporated U.S. patent application Ser. Nos. 10/455,941 and 10/455,895.

The chemical mechanical polishing platens used herein include CMP platens suitable for conductive material and/or barrier material CMP removal. Such chemical mechanical polishing articles which are fixed-abrasive or non fixed-abrasive (conventional) polishing articles and may be used in conjunction with an abrasive containing or abrasive-free polishing composition. Additionally the polishing articles for the polishing platens may be hard polishing articles, having a durometer or hardness of 50 or greater on a shore D Scale or soft polishing articles having a durometer or hardness of less than 50, typically 40 or less, on a shore D Scale. Such articles may also be perforated article or articles with pores formed therein. Examples of suitable polishing articles include, for example, a hard polishing article, such as the IC series of polishing articles including IC-1000, and a soft polishing article, such as the POLITEX™ or SUBA-4™ polishing articles available from Rodel, Inc., of Newark, Del. Fixed-abrasive articles are available from 3M Corporation of Minneapolis, Minn. and Rodel Inc., of Phoenix Ariz. The polishing articles may be porous.

Polishing Processes

Methods are provided for polishing a substrate to remove a conductive material and/or a barrier material with minimal formation of topographical defects, such as dishing within features, and minimal formation of residual material. In one embodiment of the polishing process, a first polishing step is performed to remove bulk conductive material and form a protrusion over wide feature definitions and a second polishing step is performed to remove the protrusion and planarized the conductive material. The process may also include removing a portion or all of the barrier layer in the second polishing step. The methods may be performed by electrochemical mechanical polishing (Ecmp) techniques and/or chemical mechanical polishing (CMP) techniques.

The terms wide and narrow feature definitions are relative to device size, for example, wide feature definitions are currently considered to be greater than about 2 µm in width or size and narrow feature definitions are considered to be less than or equal to about 2 µm. The invention contemplates the processes described herein being applied to the relative wide and narrow feature definitions for various device sizes. Also the invention contemplates the processes described herein to be used to polish the relative wide and narrow feature definitions for devices that exhibit the removal rate profiles, e.g., chemical mechanical polishing processes having higher removal rates over wide features as compared to narrow features, as described herein, to form the protrusion as described herein.

In one embodiment of the two-step process, conductive material is polished to form a protrusion over wide feature definitions in an electrochemical mechanical polishing process, and then the protrusion is polished and planarized to remove the conductive material in a chemical mechanical polishing process, or a second electrochemical polishing process.

The first polishing step may be an Ecmp method include including processing a substrate having a conductive material layer disposed over narrow feature definitions and wide feature definitions by supplying a polishing composition to the surface of the substrate, applying a pressure between the substrate and a polishing article, providing relative motion between the substrate and the polishing article, applying a bias between a first electrode and a second electrode in electrical contact with the substrate, and removing conductive material disposed over narrow feature definitions and substrate field areas at a higher removal rate than conductive material disposed over wide feature definitions. The lower removal rate over the wide features may allow for the formation of a protrusion over the wide feature definitions.

The method may then further includes a second polishing step of chemical mechanical polishing, and alternatively electrochemical mechanical polishing, to polish a substrate to remove conductive material disposed over narrow feature definitions at a lower removal rate than conductive material disposed over wide feature definitions and substrate field areas. By applying such a second processing step, the conductive material formed as a protrusion over the wide feature definitions may be removed and the entire conductive material planarized with minimal or reduced dishing of the wide feature definitions and minimal or reduced residual material formation over narrow feature definitions. As such, the protrusion compensates for the dishing expected during the subsequent polishing.

The two-step process may be performed on the planarizing module 106, which may be adapted to perform the steps of the polishing processes described herein. For example, a two step conductive material removal process may be performed with a first step on a Ecmp station, the first polishing station 128, and a the second step may a CMP process performed on a CMP station located at the second polishing station 130. In a further example, a two step conductive material Ecmp polishing process, the polishing station 128 may be a first Ecmp station, the second polishing station 130 may be a second Ecmp station, and third polishing station 132, which may be a third Ecmp polishing station or a CMP polishing station for removal of a barrier material. Alternatively, the first and second Ecmp stations may be adapted for performing both Ecmp conductive removal steps on the same station. The second polishing station 130, or even the first polishing station 128, may also be adapted to remove a portion or all of the barrier layer material with the second conductive material polishing process.

In one example of implementing a two-step polishing process on the planarizing module 106, bulk removal of conductive material from the substrate is performed through an electrochemical dissolution process at the bulk Ecmp station for polishing station 128. After the bulk material removal at the bulk Ecmp station, for example, the first polishing station 128, residual conductive material is removed from the substrate at the residual Ecmp station, the second polishing station 130 through a second electrochemical mechanical process. It is contemplated that more than one residual Ecmp stations 130 may be utilized in the planarizing module 106. Barrier layer material may be removed at polishing station 132 after processing at the residual Ecmp station, such as second polishing station 130, or a portion or all barrier material removed at an Ecmp polishing station. Alternatively, each of the first and second Ecmp stations 128, 130 may be utilized to perform both the two-step conductive material removal as described herein on a single station.

One embodiment of the two-step process will now be described in reference to FIGS. 8A-8E, which are schematic cross-sections views of substrate being formed according to processes described herein.

Figure 8A:
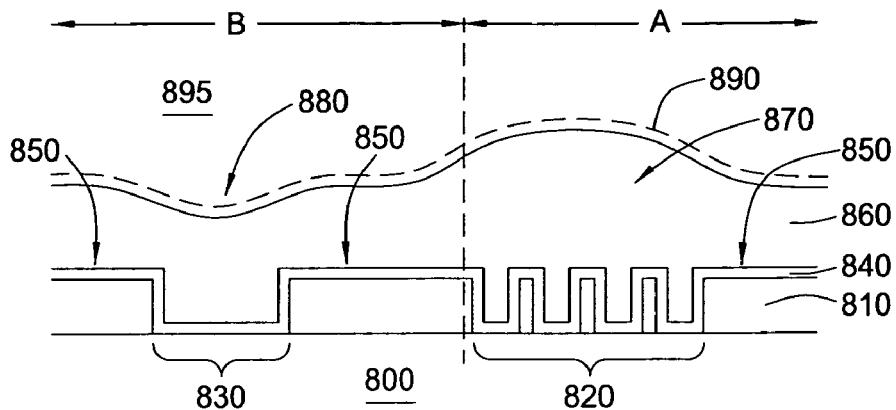
FIGS. 8A-8E are schematic cross-sectional views illustrating a polishing process performed on a substrate according to one embodiment for planarizing a substrate surface described herein.

Referring to FIG. 8A, a substrate generally includes a dielectric layer 810 formed on a substrate 800. A plurality of apertures, such as vias, trenches, contacts, or holes, are patterned and etched into the dielectric layer 810 in area A to form a dense array of narrow feature definitions 820 with area B being having a low density of wide feature definitions 830. The apertures may be formed in the dielectric layer 810 by conventional photolithographic and etching techniques.

The terms narrow and wide feature definitions may vary depending on the structures formed on the substrate surface, but can generally be characterized by the respective deposition profiles of excessive material deposition (or high overburden) formed over narrow feature definitions and minimal or low material deposition (minimal or low overburden), over wide feature definitions. For example narrow feature definitions may be less than 1 μm in size and may have a high overburden as compared to wide feature definitions that may be about 3 μm or greater in size and that may have minimal or insufficient overburden.

The dielectric layer 810 may comprise one or more dielectric materials conventionally employed in the manufacture of semiconductor devices. For example, dielectric materials may include materials such as silicon dioxide, phosphorus-doped silicon glass (PSG), boron-phosphorus-doped silicon glass (BPSG), and silicon dioxide derived from tetraethyl orthosilicate (TEOS) or silane by plasma enhanced chemical vapor deposition (PECVD). The dielectric layer may also comprise low dielectric constant materials, including fluoro-silicon glass (FSG), polymers, such as polyamides, carbon-containing silicon oxides, such as Black Diamond™ dielectric material, silicon carbide materials, which may be doped with nitrogen and/or oxygen, including BLOk™ dielectric materials, available from Applied Materials, Inc. of Santa Clara, Calif.

A barrier layer 840 is disposed conformally in the feature definitions 820 and 830 and on the field 850 of the substrate 800. The barrier layer 840 may comprise tantalum, tantalum nitride, or combinations thereof. As used throughout this disclosure, the word "tantalum" and the symbol "Ta" are intended to encompass tantalum, tantalum nitride, and alloys, such as tantalum silicon nitride, or combinations thereof. Other types of barrier layers materials may include titanium, titanium nitride, refractory metals, refractory metal nitrides, and combinations thereof, or any other material that may limit diffusion of materials between the substrate and/or dielectric materials and any subsequently deposited conductive materials.

A conductive material layer 860 is disposed on the barrier layer 840 at a thickness (D). The term "conductive material layer" as used herein is defined as any conductive material, such as copper, tungsten, or aluminum, used to fill a feature to form lines, contacts, or vias. While not shown, a seed layer of a conductive material may be deposited on the barrier layer prior to the deposition of the conductive material layer 860 to improve interlayer adhesion and improve subsequent deposition processes. The seed layer may be of the same conductive material as the subsequent conductive material layer 860 to be deposited.

One type of conductive material layer 860 comprises copper containing materials. Copper containing materials include copper, copper alloys (e.g., copper-based alloys containing at least about 80 weight percent copper), or doped copper. As used throughout this disclosure, the phrase "copper containing material," the word "copper," and the symbol "Cu" are intended to encompass copper, copper alloys, doped copper, and combinations thereof. Additionally, the conductive material may comprise any conductive material used in semiconductor manufacturing processing.

The deposited conductive material layer 860 has a deposition profile of excessive material deposition or high overburden 870 formed over narrow feature definitions 820, and minimal overburden 880 over wide feature definitions 830.

The substrate may then be positioned in a polishing apparatus, such as the apparatus descried herein and shown in FIG. 2, and exposed to a polishing composition that can form a passivation layer 890 on the conductive material layer.

An electrochemical mechanical polishing technique using a combination of chemical activity, mechanical activity, and electrical activity to remove material and planarize a substrate surface may be performed as follows. In one embodiment of an electrochemical mechanical polishing technique, the substrate is disposed in a carrier head system, as shown in FIG. 2, and physically contacted with a polishing article coupled to a polishing assembly containing first and second electrodes. Relative motion is provided between the substrate surface and the conductive article 610 to reduce or remove the passivation layer. A bias from a power source 224 is applied between the two electrodes and the substrate and polishing article are then electrically coupled with the substrate through the polishing article coupled to the first electrode. The bias may be applied by an electrical pulse modulation technique providing at least anodic dissolution. The bias may be transferred from a conductive article 610 in the polishing article assembly 222 to the substrate 208. During the physical and electrical coupling of the substrate and the polishing article, a polishing composition is provided therebetween to form a passivation layer on the substrate surface. The passivation layer may chemically and/or electrically insulate material disposed on a substrate surface.

Figure 8B:
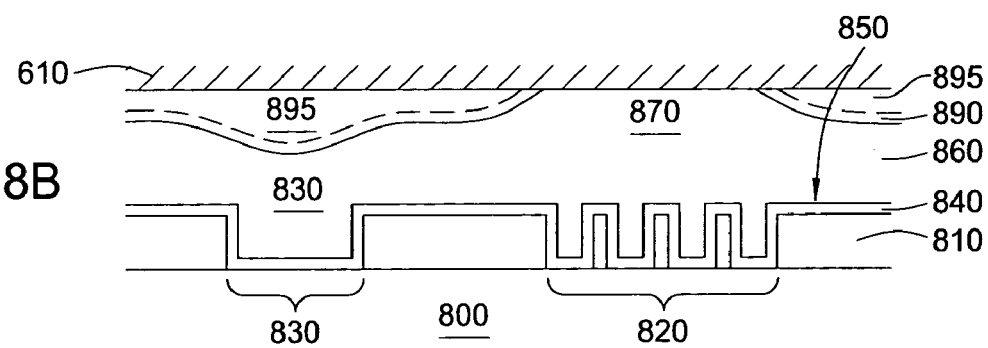
Figure 8C:
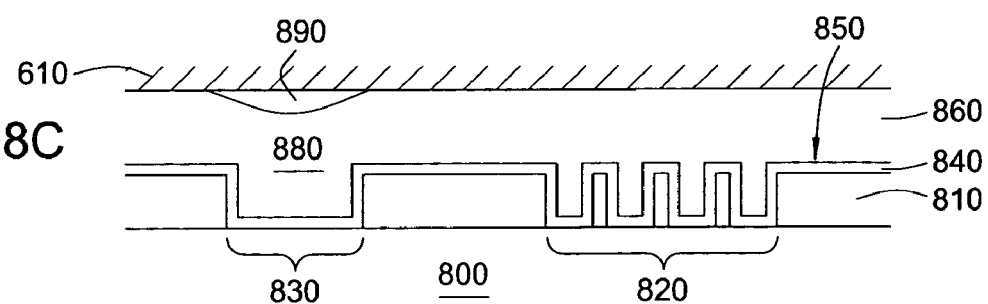
Figure 8D:
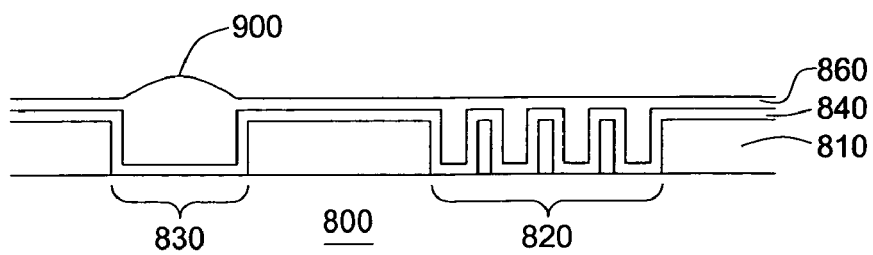
Figure 8E:
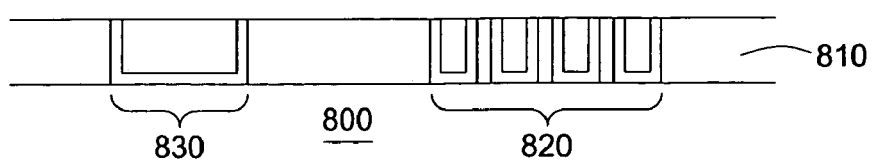

The electrochemical polishing process may have a first polishing step to remove bulk conductive material from the substrate surface to forma a protrusion 900 as shown in FIGS. 8A-8D and then a second polishing step of a chemical mechanical polishing or a second electrochemical polishing process to remove residual copper containing materials and/or barrier material to planarized the surface as shown in FIGS. 8D-8E. Bulk material is broadly defined herein as any material deposited on the substrate in an amount more than sufficient to substantially fill features formed on the substrate surface. Residual material is broadly defined as any bulk copper containing material remaining after one or more polishing process steps.

The bulk removal electrochemical mechanical polishing process may be performed on a first polishing platen and the residual removing process on a second polishing platen of the same or different polishing apparatus as the first platen. Any barrier material used to prevent conductive material diffusion through layer of a substrate may be removed on a separate platen, such as the third platen in the apparatus described herein or on a platen that removes the residual material. For example, the apparatus described above in accordance with the processes described herein may include three platens for removing bulk material or comprise one platen to remove bulk material, a second platen for residual removal, and a third platen for barrier removal.

Referring to FIG. 8A, the substrate 800 having a dielectric layer 810 patterned with narrow feature definitions 820 and wide feature definitions 830 is filled with a barrier layer 840, for example, tantalum, and an excess amount of conductive material 860, for example, copper. The deposition profile of the excess material includes the high overburden 870, also referred to as a hill or peak, formed over narrow feature definitions 820 and the minimal overburden 880, also referred to as a valley, over wide feature definitions 830.

The substrate is exposed to an Ecmp polishing composition 895 described herein that forms a passivation layer 890 on the conductive material layer 860. The passivation layer 890 forms on the exposed conductive material 860 on the substrate surface including the high overburden 870, peaks, and minimal overburden 880, valleys, formed in the deposited conductive material 860. The passivation layer 890 chemically and/or electrically insulates the surface of the substrate from chemical and/or electrical reactions. The passivation layer is formed from the exposure of the substrate surface to the corrosion inhibitor and/or other materials capable of forming a passivating or insulating film, for example, chelating agents. The thickness and density of the passivation layer can dictate the extent of chemical reactions and/or amount of anodic dissolution. For example, a thicker or denser passivation layer 890 has been observed to result in less anodic dissolution compared to thinner and less dense passivation layers. Thus, control of the composition and concentration of passivating agents, corrosion inhibitors and/or chelating agents, allows for customized removal rates and amounts of material removed from the substrate surface.

The substrate surface and a polishing article, such as conductive article 610, are contacted with one another and moved in relative motion to one another, such as in a relative orbital motion, to remove portions of the passivation layer 890 formed on the exposed conductive material 860 as shown in FIG. 8B, which may also remove a portion of the underlying conductive material 860. The first conductive material polishing step, an electrochemical mechanical polishing step, is performed for FIGS. 8A-8D as follows to form the protrusion 900.

The electrochemical mechanical polishing process includes contacting the substrate surface and polishing article at a pressure less than about 2 psi. Removal of the passivation layer 890 and some conductive material 860 may be performed with a process having a contact pressure less than about 2 pounds per square inch (lb/in$^2$ or psi) (13.8 kPa). The contact pressure may include a pressure of about 1 psi (6.9 kPa) or less, for example, between about 0.01 psi (69 Pa) and about 1 psi (6.9 kPa), such as between about 0.1 (0.7 kPa) psi and about 0.8 psi (5.5 kPa) or between about 0.1 (0.7 kPa) psi and less than about 0.5 psi (3.4 kPa). In one aspect of the process, a pressure of about 0.3 psi (2.1 kPa) or about 0.2 psi (1.4 kPa) may be used during a processing step.

The polishing pressures used herein reduce or minimize damaging shear forces and frictional forces for substrates containing low k dielectric materials. Reduced or minimized forces can result in reduced or minimal deformations and defect formation of features from polishing. Further, the lower shear forces and frictional forces have been observed to reduce or minimize formation of topographical defects, such as dishing and scratches, and delamination, during polishing. Contact between the substrate and a conductive article also allows for electrical contact between the power source and the substrate by coupling the power source to the polishing article when contacting the substrate.

Relative motion is provided between the substrate surface and the polishing article to reduce or remove the passivation layer 890. The relative motion may be provided by rotating the polishing article and substrate during the process. In one expel of a rotating process, the polishing article disposed on the platen is rotated at a platen rotational rate of between about 7 rpm and about 80 rpm, for example, about 28 rpm, and the substrate disposed in a carrier head is rotated at a carrier head rotational rate between about 7 rpm and about 80 rpm, for example, about 37 rpm. The respective rotational rates of the platen and carrier head are believed to provide reduced shear forces and frictional forces when contacting the polishing article and substrate. Both the carrier head rotational speed and the platen rotational speed may be between about 7 rpm and less than about 40 rpm.

In one aspect of rotating process, the carrier head rotational speed may be greater than a platen rotational speed by a ratio of carrier head rotational speed to platen rotational speed of greater than about 1:1, such as a ratio of carrier head rotational speed to platen rotational speed between about 1.2:1 and about 7:1, for example between about 1.2:1 and about 3:1, to remove material from the substrate surface.

A combination of contact and relative motion between the substrate and the polishing article provided mechanical abrasion that may allow a region of non-passivated conductive material to be removed and/or exposed to a bias for removal by anodic dissolution.

A bias is applied to the substrate during contact between the substrate surface and the conductive article 610 for anodic dissolution of the conductive material 860 from the substrate surface. The bias is generally provided to produce anodic dissolution of the conductive material from the surface of the substrate at a current density between about 0.001 milliamps/centimeter (mA/cm$^2$) and about 100 mA/cm$^2$ which correlates to an applied current of about 40 amps to process substrates with a diameter up and about 300 mm. For example, a 200 mm diameter substrate may have a current density between about 0.01 mA/cm$^2$ and about 50 mA/cm$^2$.

The invention also contemplates that the bias may be applied and monitored by volts, amps and watts. For example, in one embodiment, the power supply may apply a power between about 0.01 watts and 100 watts, a voltage between about 0.01 V and about 10 V, and a current between about 0.01 amps and about 20 amps. In a further example, a bias between about 2.6 volts and about 3.5 volts, such as 3 volts, may be used as the applied bias in the electrochemical processing step.

During anodic dissolution under application of the bias, the substrate surface, which includes the conductive material layer 860, may be biased anodically above a threshold potential of the conductive material, for example, a metal material, on the substrate surface to "oxidize". When a metal material oxidizes, a metal atom gives up one or more electrons to the power source 224 and forms metal ions or cations. The metal ions may then leave the substrate surface and dissolve into the electrolyte solution. In the case where copper is the desired material to be removed, cations can have the $Cu^{1+}$ or $Cu^{2+}$ oxidation state.

The metal ions may also contribute to the formation of the thickness and/or density of the passivation layer 890. For example, the inhibitors and/or chelating agents found in the polishing composition may complex with the metal ions and the metal ions become incorporated into the passivation layer 890. Thus, the presence of the inhibitors and/or chelating agents found in the polishing composition limit or reduce the electrochemical dissolution process of the metal ions into the electrolyte, and further incorporate such metal ions into the passivation layer 890.

It has been observed that the thickness and/or density of the undisturbed passivation layer may increase after periods of applied bias for anodic dissolution of conductive materials on the substrate surface. It is believed that the increase in the thickness and/or density of the undisturbed passivation layer is related to the total applied power and is a function of time and/or power levels. It has also been observed that the undisturbed passivation layer incorporates metal ions and that the metal ions may contribute to the thickness and/or density of the passivation layer.

The bias may be varied in power and application depending upon the user requirements in removing material from the substrate surface. For example, increasing power application has been observed to result in increasing anodic dissolution. The bias may also be applied by an electrical pulse modulation technique. Pulse modulation techniques may vary, but generally include a cycle of applying a constant current density or voltage for a first time period, then applying no current density or voltage or a constant reverse current density or voltage for a second time period. The process may then be repeated for one or more cycles, which may have varying power levels and durations. The power levels, the duration of power, an "on" cycle, and no power, an "off" cycle" application, and frequency of cycles, may be modified based on the removal rate, materials to be removed, and the extent of the polishing process. For example, increased power levels and increased duration of power being applied have been observed to increase anodic dissolution.

In one pulse modulation process for electrochemical mechanical polishing, the pulse modulation process comprises an on/off power technique with a period of power application, "on," followed by a period of no power application, "off". The on/off cycle may be repeated one or more times during the polishing process. The "on" periods allow for removal of exposed conductive material from the substrate surface and the "off" periods allow for polishing composition components and by-products of "on" periods, such as metal ions, to diffuse to the surface and complex with the conductive material. During a pulse modulation technique process it is believed that the metal ions migrate and interact with the corrosion inhibitors and/or chelating agents by attaching to the passivation layer in the non-mechanically disturbed areas. The process thus allows etching in the electrochemically active regions, not covered by the passivation layer, during an "on" application, and then allowing reformation of the passivation layer in some regions and removal of excess material during an "off" portion of the pulse modulation technique in other regions. Thus, control of the pulse modulation technique can control the removal rate and amount of material removed from the substrate surface.

The "on"/"off" period of time may be between about 0.1 seconds and about 60 seconds each, for example, between about 2 and about 25 seconds, and the invention contemplates the use of pulse techniques having "on" and "off" periods of time greater and shorter than the described time periods herein. In one example of a pulse modulation technique, power is applied between about 40% and about 98% of each cycle.

Non-limiting examples of pulse modulation technique with an on/off cycle for electrochemical mechanical polishing of materials described herein include: applying power, "on," between about 5 and about 10 seconds and then not applying power, "off," between about 2 and about 25 seconds; applying power for about 10 seconds and not applying power for 5 seconds, or applying power for 10 seconds and not applying power for 2 seconds, or even applying power for 5 seconds and not applying power for 25 seconds to provide the desired polishing results. The cycles may be repeated as often as desired for each selected process. One example of a pulse modulation process is described in U.S. Pat. No. 6,379,223, entitled "Method and Apparatus for Electrochemical Mechanical Planarization," issued on Apr. 22, 2002, which is incorporated by reference herein to the extent not inconsistent with the claimed aspects and disclosure herein. Further examples of a pulse modulation process is described in co-pending U.S. patent application Ser. No. 10/611,805, entitled "Effective Method To Improve Surface Finish In Electrochemically Assisted Chemical Mechanical Polishing," filed on Jun. 30, 2003, which is incorporated by reference herein to the extent not inconsistent with the claimed aspects and disclosure herein.

A removal rate of conductive material of up to about 15,000 Å/min can be achieved by the processes described herein. Higher removal rates are generally desirable, but due to the goal of maximizing process uniformity and other process variables (e.g., reaction kinetics at the anode and cathode) it is common for dissolution rates to be controlled between about 100 Å/min and about 15,000 Å/min. In one embodiment of the invention where the copper material to be removed is less than 5,000 Å thick, the voltage (or current) may be applied to provide a removal rate between about 100 Å/min and about 5,000 Å/min. The substrate is typically exposed to the polishing composition and power application for a period of time sufficient to remove at least a portion or all of the desired material disposed thereon.

Referring to FIG. 8C, mechanical abrasion by the conductive article 610 removes the passivation layer that insulates or suppresses the current for anodic dissolution, such that areas of high overburden 870 and the substrate field 850 are preferentially removed over areas of minimal overburden 880 as the passivation layer is retained in areas of minimal or no contact with the conductive article 610. The removal rate of the conductive material 860 covered by the passivation layer is less than the removal rate of conductive material without the passivation layer. As such, the excess material disposed over narrow feature definitions 820 and the substrate field 850 is removed at a higher rate than over wide feature definitions 830 still covered by the passivation layer 890.

Referring to FIG. 8D, the process described herein may allow for the formation of a protrusion 900 in the conductive material layer 860 formed over the wide features. The protrusion 900 is formed from material that was unpolished or polished at a reduced removal rate due to the formation of a thicker or denser passivation layer or for longer durations than other portions of the conductive material layer 860. For example, the protrusion may be between about 5% an about 60% of the deposited conductive material thickness, such as between about 10% and about 40% of the deposited conductive material thickness. The processes described herein have been observed herein to produce a protrusion between about 20% and about 30% of the deposited material thickness. The desired level of protrusion of the deposited conductive material thickness may vary based on the processing factors, such as the respective removal rates of additional polishing steps and the duration of overpolishing, if any.

The amount or size of the protrusion 900 may be controlled by modifying or varying the removal rate profile of the first polishing process step. For example, by varying the chemistry of the polishing composition used in the process, the power application, such as power levels, the process parameters of a pulse modulation technique, or a combination thereof, may all be used to affect the size of the protrusion 900. With regard to the polishing compositions, the size of the protrusions may be controlled by the amount of corrosion inhibitor, chelating agents, the pH levels, or a combination thereof. The invention contemplates that the compositions described herein and the power applications described herein may be varied beyond the illustrative examples detailed herein to achieve the formation of a protrusion herein and/or the relative removal rates over wide and narrow feature definitions.

For example, increase amounts of corrosion inhibitor were observed to increase the amount protrusion over wide features as compared to reduced amounts of corrosion inhibitors. In one comparison example under identical polishing conditions for a polishing layer of about 11,500 Å thick with a step height of about 6,000 Å, a polishing process with a composition of 0.3 wt. % benzotriazole (BTA) as a corrosion inhibitor exhibited a protrusion height of about 4,200 Å, about a 36.5% protrusion of the deposited conductive material, and a polishing process with a composition of 0.2 wt. % BTA as a corrosion inhibitor exhibited a protrusion height of about 800 Å, about a 7% protrusion of the deposited conductive material. In another comparison example, under identical polishing conditions but different from the first comparison example, a polishing process with a composition of 0.3 wt. % BTA as a corrosion inhibitor exhibited a protrusion of about 2,500 Å, about a 22% protrusion of the deposited conductive material, and a polishing process with a composition of 0.2 wt. % BTA as a corrosion inhibitor exhibited a protrusion of about 0 Å, or no observable protrusion.

The pH of the composition has also been observed to affect the amount of protrusion. Compositions having less acidic pH levels, i.e., more basic pH levels, composition were observed to have greater protrusion height over composition with more acidic pH levels. For example, protrusions were observed to be formed at pH levels of greater than 4.5, for example between about 5.5 and about 7. In a comparison example under identical polishing conditions, a polishing process with a pH of 6.5 exhibited a protrusion height of about 3,000 Å, about a 26% protrusion of the deposited conductive material, a polishing process with a pH of about 5.8 exhibited a protrusion height of about 200 Å, about a 1.7% protrusion of the deposited conductive material, and a polishing process with a pH of about 4.5 exhibited a protrusion height of about 0 Å, or no observable protrusion height. Further, a balance of pH and corrosion inhibitor concentration may be used to provide for a selective amount of protrusion. For example a more basic pH level at a lower corrosion inhibitor concentration may produce the same amount of protrusion as a more acidic pH level with a greater corrosion inhibitor concentration.

Power application may also be adapted to control the amount of protrusion in the process. For example, with same or similar processing compositions, a power application with a greater amount of power application in the "on" portion of the pulse modulation technique exhibited greater protrusion height formation than a power application with a lesser amount of applied power in the "on" portion of the pulse modulation technique. Additionally, for protrusion removal in a second electrochemical mechanical processing step, a power application a power application with a lesser amount of power application in the "on" portion of the pulse modulation technique compared to the "off" portion exhibited planarization and protrusion removal.

Power applied during the process may be referenced as voltage, current, current density, wattage, or other suitable means for monitoring and controlling the anodic dissolution process. A greater amount of power application may be achieved, for example, by an increase in the power level, i.e., increase voltage, current, current density, or wattage, an increase in the duration of a power period or pulse, or a combination thereof. Power and pulse modulation techniques may be varied based on changes in the processing parameters, for example, different electrolyte composition, may have different conductivities, and may require different power levels and pulse modulations.

It is believed that when power is applied, the "on" position, the formation of the passivation layer may increase in thickness and/or density because of metal ions complexing with components of the passivation layer, and in the "off" position, the passivation layer is subject to more abrasion and removal, due to ion starvation in the electrolyte near the surface of the conductive material being removed. An increase in thickness or density of the passivation layer is believed to result in better chemical and/or electrical insulative properties as well as increased resistance to removal by abrasion.

Thus, an increase in the total power applied to the substrate, such as an increase in the duration or magnitude of the applied power has been observed to result in increased protrusion height. In one comparison example using a composition having 0.3 wt % BTA and a pH between about 5.5 and about 7 under similar processing conditions, a protrusion height of about 4,000 Å for a metal layer of about 11,500 Å or less, about a 35% protrusion of the deposited conductive material, was observed to be formed under an "on" only power application, while a pulse modulation technique of 5 seconds "on" and 5 seconds "off" has been observed to result in a protrusion height of less than 400 Å.

The two-step conductive material polishing process described herein allows for the second step to planarize the protrusion 900 with minimal or reduced topographical defects, including reduced or minimal dishing, minimal conductive material residue, increased substrate processing through put, reduced composition costs, especially on the second process step, with minimal or reduced overpolishing of the substrate surface.

Referring to FIG. 8E, any remaining conductive material and barrier layer material may then be polished by one or more additional polishing steps to provide a planarized substrate surface. For example, a second polishing step may be used to remove the residual conductive material and all or a portion of the barrier layer material. Alternatively, a second polishing step may remove only the conductive material, or a portion of the barrier layer, with a third polishing step may be used to remove the remaining portion of all of the barrier layer material. In a further alternative polishing embodiment, the conductive material is removed by a first polishing step, the barrier is removed in a second polishing step, and any buffing or dielectric material, such as a polishing resistance capping layer, may be removed in a third polishing step by a chemical mechanical polishing process.

In an alternative embodiment of the two-step conductive material polishing process further having a barrier polishing step, the second polishing step removes a portion of the protrusion, and the remainder of the protrusion is removed in the barrier polishing step. The remaining protrusion of the conductive material can minimize or reduce dishing of the conductive material, such as copper, in the features during the CMP and Ecmp barrier polishing step. The second conductive material polishing step may be performed by polishing the surface with a planarization efficiency, such as between about 10% and about 90%, such as between 20% and 80%, for example, between about 40% and about 60%. Such planarization efficiencies provide a second protrusion (not shown) between about 10% and about 90%, such as between 20% and 80%, for example, between about 40% and about 60%, of the protrusion 900 following the first polishing step. Planarization efficiency is defined as a reduction of the step height of deposited material, which in reference to FIG. 8D, comprises a reduction of the protrusion 900 as compared to any remaining residual material and/or the barrier layer.

The remaining conductive material and/or barrier layer material may be removed by a chemical mechanical polishing process. Since chemical mechanical polishing processes have been observed to remove material from over in wide feature definitions at higher removal rates as compared to material disposed over narrow feature definitions, the protrusion 900 of conductive material allows for planarization of the residual conductive material with minimal or reduced dishing in the wide feature definitions and minimal or no residue formation over narrow feature definitions. In addition, abrasive free CMP or Ecmp processes that may be used for the second polishing step result in a process using a lower cost slurry than in abrasive containing composition conventionally used to polish conductive material with less formation of abrasive related defects, such as scratching.

Additionally, when the second polishing step is a chemical mechanical polishing step, a composition for the chemical mechanical polishing process may be adapted to provide a desired profile for removing the protrusion and planarizing the substrate rather than protrusion formation as described in the electrochemical mechanical polishing step. For example, the chemical mechanical polishing process may have a composition having an amount of corrosion inhibitor less than another composition in the first polishing step. In another example, the chemical mechanical polishing process may have a composition having a more acidic pH level than another composition in the first polishing step. In an additional example, the chemical mechanical polishing process may have a composition having a reduced amount of abrasive concentration, including being abrasive free, as compared to another composition in the a first polishing step Additionally, a combination of carrion inhibitor concentrations, pH levels, and abrasive materials may be used to provide the desired polishing profile. Further, the second composition may be the same composition as the first composition with different corrosion inhibitor, pH levels, abrasive concentrations, or combinations thereof, as described herein may be used for the first and second polishing steps.

The second polishing step may alternatively use a commercial CMP formulation including, for example, the iCue® 5001 composition, the iCue® 5306E composition, or the EP-C7091 composition from the Cabot Corporation, of Tuscola, Ill., CU3900-10 k composition from DuPont Air Products NanoMaterials L.L.C, Tempe, Ariz., 7105 from Fujimi of Aichi, Japan, the CMS 7401 composition and CMS 7452 composition, from JSR of Tpkyo, Japan, and HS-T815-5A from Hitachi Chemical Co., Ltd, Ibaraki, Japan. The CMP processing steps described herein may be used on the same platens as shown in FIGS. 2-7 as the Ecmp process described herein, without the application of power to the station. Any suitable CMP composition that has a removal rate, such as 3,000 Å/minute or greater, over broad feature definitions and lower removal rate over narrower feature definitions, such as less than about 3,000 Å/minute, may be used as the second polishing composition. Further, the CMP process may comprise a polishing process with a hard article or soft article conventional CMP polishing article as described herein with an abrasive or abrasive free polishing composition as described herein.

Alternatively, the second polishing step may also be an electrochemical mechanical polishing step as described herein. The second electrochemical mechanical polishing step may be adapted to have material disposed on the substrate surface removed at higher removal rates over wide feature definitions as compared to the first polishing step or as compared to removal rates of material disposed over narrow feature definitions to provide for planarization of the conductive material. The relative removal rates of the second electrochemical mechanical polishing step may be adapted to be comparable to removal rate profiles observed in chemical mechanical polishing processes as described herein. If a third step is used to remove the barrier material layer, a third Ecmp process step may also be used as an alternative to a CMP processing step. In a further alternative polishing process, the conductive material is removed selectively with protrusion formation in a first processing step, and the conductive material having the protrusion formed therein and barrier material is removed in a second processing step.

An Ecmp removal rate profile of the second polishing process to polishing the substrate with protrusion removal and reduced or minimal dishing may be achieved by several approaches. In one example, a second Ecmp polishing step may be performed with a modified version of the first polishing composition under the same processing conditions. The modified composition for the second Ecmp processing step may include a lesser amount of corrosion inhibitor, a lesser abrasive concentration, or a more acidic pH level than the first Ecmp polishing step allowing for protrusion formation in the first polishing step and no protrusion development in the second polishing step.

Additionally, a separate polishing composition as described herein as the second Ecmp polishing composition may be used in the second polishing process to achieve the desired polishing profile. The second Ecmp composition that have been observed to provide effective polishing results include minimal abrasive or abrasive free polishing compositions including citrate based compositions, EDA based compositions, and glycine based compositions as described and provided as examples further herein.

In another example, the removal rate profile may be achieved by an electrical based process including a pulse modulation technique for the second polishing step may be used that increases removal rate over wide features as compared to a pulse modulation technique in the first polishing step to control protrusion formation and relative removal rates. A combination of corrosion inhibitor concentrations, pH levels, and pulse modulation techniques may be used for both the first and second polishing steps to provide the desired removal rate profiles to produce or remove protrusions as desired.

The entire barrier layer or a portion of the barrier layer may be removed by a separate process or by the second processing step as described herein. The barrier layer may be selectively or non-selectively removed compared to the conductive material. The composition for barrier layer removal may provide a barrier material selectivity at a removal rate ratio of barrier material to conductive material between greater than about 1:1 to about 5:1, which may vary on protrusion height. Alternatively, the compositions may have removal rate ratios of conductive material to barrier material to dielectric material of about 1:1:1.

The barrier layer may be removed by CMP or Ecmp processes, for example, as described in U.S. patent application Ser. No. 11/130,032, dated May 16, 2005, which is incorporated by reference herein to the extent not inconsistent with the claimed aspects and disclosure herein. Alternatively, the barrier material may be removed with a CMP process having a commercial composition, such as the 6605 and 6618 compositions from Cabot Corp. of Aurora, Ill. The barrier removal process may comprise a chemical mechanical polishing process with a hard article or soft article conventional CMP polishing article as described herein with an abrasive or abrasive free polishing composition.

An example of a copper CMP polishing process is disclosed in U.S. Pat. No. 6,790,768, issued on Sep. 14, 2004, and entitled "Method And Apparatus For Polishing Metal And Dielectric Substrates," and an example of a barrier CMP polishing process is disclosed in U.S. patent application Ser. No. 10/193,810, filed On Jul. 11, 2002, and entitled "Dual Reduced Agents For Barrier Removal In Chemical Mechanical Polishing," which are both incorporated herein to the extent not inconsistent with the claims aspects and disclosure herein.

Optionally, a cleaning solution may be applied to the substrate after each of the polishing process to remove particulate matter and spent reagents from the polishing process as well as help minimize metal residue deposition on the polishing articles and defects formed on a substrate surface. An example of a suitable cleaning solution is ElectraClean™ commercially available from Applied Materials, Inc., of Santa Clara, Calif.

After conductive material and barrier material removal processing steps, the substrate may then be buffed to minimize surface defects. Buffing may be performed with a soft polishing article, i.e., a hardness of about 40 or less on the Shore D hardness scale as described and measured by the American Society for Testing and Materials (ASTM), headquartered in Philadelphia, Pa., at reduced polishing pressures, such as about 2 psi or less. An example of a suitable buffing process and composition is disclosed in co-pending U.S. patent application Ser. No. 09/569,968, filed on May 11, 2000, and incorporated herein by reference to the extent not inconsistent with the invention.

Finally, the substrate may be exposed to a post polishing cleaning process to reduce defects formed during polishing or substrate handling. Such processes can minimize undesired oxidation or other defects in copper features formed on a substrate surface. An example of such a post polishing cleaning is the application of Electra Clean™, commercially available from Applied Materials, Inc., of Santa Clara, Calif.

It has been observed that substrate planarized by the processes described herein have exhibited reduced topographical defects, such as dishing, reduced residues, improved planarity, and improved substrate finish. The processes described herein may be further disclosed by the examples as follows.

Polishing Compositions

Electrochemical mechanical polishing (Ecmp) compositions are provided for electrochemical mechanical polishing processing steps including, for example a conductive material Ecmp polishing composition or two compositions for a two-step conductive material Ecmp polishing process involving a protrusion formation in the first step and a protrusion removal and planarization in a second step.

Suitable electrochemical mechanical polishing compositions that may be used with the processes described herein to planarize metals, such as copper, may comprise a first, or bulk, abrasive free polishing composition including an acid based electrolyte, a chelating agent, an oxidizer, a corrosion inhibitor, an inorganic or organic acid salt, a pH adjusting agent, a pH between about 3 and about 10, and a solvent. Alternatively, the bulk polishing composition may also include abrasive particulates. The bulk polishing composition may be used to provide for a protrusion as described herein.

An abrasive free second, or residual, polishing composition may include an acid based electrolyte, a chelating agent, a corrosion inhibitor, a pH adjusting agent, a pH between about 3 and about 10, and a solvent as described herein for the bulk polishing composition. The composition may be oxidizer free, or alternatively, include an oxidizer as described herein. In one embodiment of the residual polishing composition, the chelating agent may comprise an amine based chelating agent as described herein, and in another embodiment, the chelating agent may comprise a compound having an carboxylic acid group as described herein. In a further embodiment, an inorganic or organic acid salt may be used in place of the amine based chelating agent or a compound having an carboxylic acid group as described herein. Alternatively, the residual polishing compositions may also include abrasive particulates. The constituents of the residual polishing composition are as described herein for the bulk polishing composition unless otherwise specified.

Although the electrochemical mechanical polishing compositions are particularly useful for removing the conductive material copper, it is believed that the polishing compositions also may be used for the removal of other conductive materials, such as aluminum, platinum, tungsten, cobalt, gold, silver, ruthenium and combinations thereof, and barrier materials, such as titanium, titanium nitride, tantalum, tantalum nitride, and combinations thereof, which may also be conductive materials.

A bulk polishing composition, a first electrochemical mechanical polishing step composition, may include an acid based electrolyte, a chelating agent, an oxidizer, a corrosion inhibitor, an inorganic or organic acid salt, abrasive particles, a pH adjusting agent, a pH between about 3 and about 10, and a solvent.

The acid based electrolyte system provides for electrical conductivity of the composition in Ecmp processes. Suitable acid based electrolyte systems include, for example, phosphoric acid based electrolytes, sulfuric acid based electrolytes, nitric acid based electrolytes, perchloric acid based electrolytes, acetic acid based electrolytes, citric acid based electrolytes, boric acid based electrolytes and combinations thereof. Suitable acid based electrolytes include electrolyte salt derivatives including ammonium, potassium, sodium, calcium and copper salts derivatives thereof. The acid based electrolyte system may also buffer the composition to maintain a desired pH level for processing a substrate.

Examples of suitable acid based electrolytes include compounds having a phosphate group ($PO_4^{3-}$), such as, phosphoric acid, copper phosphate, potassium phosphates ($K_xH_{(3-x)}PO_4$) (x=1, 2 or 3), such as potassium dihydrogen phosphate ($KH_2PO_4$), dipotassium hydrogen phosphate ($K_2HPO_4$), ammonium phosphates (($NH_4)_xH_{(3-x)}PO_4$) (x=1, 2 or 3), such as ammonium dihydrogen phosphate (($NH_4)H_2PO_4$), diammonium hydrogen phosphate (($NH_4)_2HPO_4$), compounds having a nitrite group ($NO_3^{1-}$), such as, nitric acid or copper nitrate, compounds having a boric group ($BO_3^{3-}$), such as, orthoboric acid ($H_3BO_3$) and compounds having a sulfate group ($SO_4^{2-}$), such as sulfuric acid ($H_2SO_4$), ammonium hydrogen sulfate (($NH_4)HSO_4$), ammonium sulfate, potassium sulfate, copper sulfate, derivatives thereof and combinations thereof. The invention also contemplates that conventional electrolytes known and unknown may also be used in forming the composition described herein using the processes described herein.

The acid based electrolyte system may contains an acidic component that can take up about 1 and about 30 percent by weight (wt %) or volume (vol %) of the total composition of solution to provide sufficient conductivity as described herein for practicing the processes described herein. Examples of acidic components include dihydrogen phosphate and/or diammonium hydrogen phosphate and may be present in the bulk polishing composition in amounts between about 15 wt % and about 25 wt %. Alternately, phosphoric acid may be present in concentrations up to 30 wt %, for example, between about 0.5 wt % and about 6 wt %. The acid based electrolyte may also be added in solution, for example, the 6 wt. % of phosphoric acid may be from 85% aqueous phosphoric acid solution for an actual phosphoric acid composition of about 5.1 wt. %.

One aspect or component of the present invention is the use of one or more chelating agents to complex with the surface of the substrate to enhance the electrochemical dissolution process. In any of the embodiments described herein, the chelating agents can bind to a conductive material, such as copper ions, increase the removal rate of metal materials and/or improve dissolution uniformity across the substrate surface. The metal materials for removal, such as copper, may be in any oxidation state, such as 0, 1, or 2, before, during or after ligating with a functional group. The functional groups can bind the metal materials created on the substrate surface during processing and remove the metal materials from the substrate surface. The chelating agents may also be used to buffer the bulk polishing composition to maintain a desired pH level for processing a substrate. The chelating agents may also form or enhance the formation of the second passivation layer on the substrate surface.

The one or more chelating agents may include compounds having one or more functional groups selected from the group of amine groups, amide groups, and combinations thereof. The one or more chelating agents may include compounds having one or more functional groups selected from the group of carboxylate groups, hydroxyl groups, a mixture of hydroxyl and carboxylate groups, and combinations thereof. The carboxylate groups include dicarboxylate groups and tricarboxylate groups. Alternatively, the chelating agent may comprise a compound having one or more functional groups selected from the group of amine groups, amide groups, carboxylate groups, dicarboxylate groups, tricarboxylate groups, hydroxyl groups, a mixture of hydroxyl and carboxylate groups, and combinations thereof, such as amino acids. The Ecmp polishing compositions may include one or more chelating agents at a concentration between about 0.1% and about 15% by volume or weight, but preferably utilized between about 0.1% and about 4% by volume or weight. For example, about 2% by volume of ethylenediamine may be used as a chelating agent.

Examples of suitable chelating agents include compounds having one or more amine and amide functional groups include ethylenediamine (EDA), diethylenetriamine, diethylenetriamine derivatives, hexadiamine, methylformamide, derivatives thereof, salts thereof and combinations thereof. Examples of suitable chelating agents having one or more carboxylate groups include citric acid, tartaric acid, succinic acid, oxalic acid, acetic acid, adipic acid, butyric acid, capric acid, caproic acid, caprylic acid, glutaric acid, glycolic acid, formaic acid, fumaric acid, lactic acid, lauric acid, malic acid, maleic acid, malonic acid, myristic acid, plamitic acid, phthalic acid, propionic acid, pyruvic acid, stearic acid, valeric acid, derivatives thereof, and combinations thereof. Compounds having both amine and carboxylate functional groups include amino acids, such as glycine, and compounds such as ethylenediaminetetraacetic acid (EDTA).

Inorganic or organic salts are provided at a concentration between about 0.1% and about 15% by volume or weight of the Ecmp composition, for example, between about 0.1% and about 8% by volume or weight. For example, about 2% by weight of ammonium citrate may be used in the polishing composition. The inorganic salt or organic salt may also function as a chelating agent. The inorganic salt or organic salt may also be added in solution or in a substantially pure form, for example, ammonium citrate may be added in a 98% pure form.

Examples of suitable inorganic or organic acid salts include ammonium and potassium salts or organic acids, such as ammonium oxalate, ammonium citrate, ammonium succinate, monobasic potassium citrate, dibasic potassium citrate, tribasic potassium citrate, potassium tartarate, ammonium tartarate, potassium succinate, potassium oxalate, and combinations thereof. Additionally, ammonium and potassium salts of the carboxylate acids may also be used. For example, chelating agents may include ammonium citrate, potassium citrate, ammonium succinate, potassium succinate, ammonium oxalate, potassium oxalate, potassium tartrate, and combinations thereof. The salts may have multi-basic states, for example, citrates have mono-, di- and tri-basic states. The salts may also include derivatives of the chelating agents described herein, for example, EDTA has salts that may be used in the composition, for example, a variety of salts, such as sodium, potassium and calcium (e.g., $Na_2EDTA$, $Na_4EDTA$, $K_4EDTA$ or $Ca_2EDTA$).

In any of the embodiments described herein, the corrosion inhibitors can be added to reduce the oxidation or corrosion of metal surfaces by enhancing the formation of the second passivation layer 890 that minimizes the chemical interaction between the substrate surface and the surrounding electrolyte. The layer of material formed by the corrosion inhibitors thus tends to suppress or minimize the electrochemical current from the substrate surface to limit electrochemical deposition and/or dissolution. The bulk polishing composition may include between about 0.001% and about 5.0% by weight of the organic compound from one or more azole groups, for example, between about 0.01% and about 1% by weight. The commonly preferred range being between about 0.2% and about 0.4% by weight. The corrosion inhibitor may also be added in solution or in a substantially pure form, for example, benzotriazole may be added in a 99% pure form.

Suitable corrosion inhibitors include compounds having a nitrogen atom (N), such as organic compounds having azole groups. Examples of suitable compounds include benzotriazole (BTA), mercaptobenzotriazole, 5-methyl-1-benzotriazole (TTA), and combinations thereof. Other suitable corrosion inhibitors include film forming agents that are cyclic compounds, for example, imidazole, benzimidazole, triazole, and combinations thereof. Derivatives of benzotriazole, imidazole, benzimidazole, triazole, with hydroxy, amino, imino, carboxy, mercapto, nitro and alkyl substituted groups may also be used as corrosion inhibitors. Other corrosion inhibitor includes urea and thiourea among others.

Alternatively, polymeric inhibitors, for non-limiting examples, polyalkylaryl ether phosphate, ammonium nonylphenol ethoxylate sulfate, or polyethyleneamines may be used in replacement or conjunction with azole containing corrosion inhibitors in an amount between about 0.002% and about 1.0% by volume or weight of the composition. Another example of polymeric inhibitors include ethylenimine based polymeric materials, such as polyethylenimine (PEI) having a molecular weight between about 400 and about 1,000,000 comprising ($-CH_2-CH_2-N-$) monomer units, ethyleneglycol based polymeric materials, such as polyethyleneglycol (PEG) having a molecular weight between about 200 and about 100,000 comprising ($-H(OCH_2CH_2)NOH-$) monomer units. Polyamine and polyimide polymeric material may also be used as polymeric inhibitors in the composition. Other suitable polymeric inhibitors include oxide polymers, such as, polypropylene oxide and ethylene oxide propylene oxide polymer (EOPO), with a Molecular Weight range between about 200 and about 100,000. An example of a suitable polymeric inhibitor includes XP-1296, containing polyamine polymer, commercially available from Rohm and Hass Electronic Materials of Marlborough, Mass., and Compound S-900, commercially available from Enthone-OMI, Inc., of New Haven, Conn.

Oxidizers can be present in the polishing composition in an amount ranging between about 0.01% and about 100% by volume or weight, for example, between about 0.1% and about 20% by volume or weight. In an embodiment of the bulk polishing composition, between about 0.1% and about 15% by volume or weight of hydrogen peroxide is present in the bulk polishing composition. In one embodiment, the oxidizer is added to the rest of the bulk polishing composition just prior to beginning the electrochemical mechanical polishing process. The oxidizer may be added to the composition in a solution, such as a 30% aqueous hydrogen peroxide solution or a 40% aqueous hydrogen peroxide solution.

Examples of suitable oxidizers include peroxy compounds, e.g., compounds that may disassociate through hydroxy radicals, such as hydrogen peroxide and its adducts including urea hydrogen peroxide, percarbonates, and organic peroxides including, for example, alkyl peroxides, cyclical or aryl peroxides, benzoyl peroxide, peracetic acid, and ditertbutyl peroxide. Sulfates and sulfate derivatives, such as monopersulfates and dipersulfates may also be used including for example, ammonium peroxydisulfate, potassium peroxydisulfate, ammonium persulfate, and potassium persulfate. Salts of peroxy compounds, such as sodium percarbonate and sodium peroxide may also be used.

The oxidizer can also be an inorganic compound or a compound containing an element in its highest oxidation state. Examples of inorganic compounds and compounds containing an element in its highest oxidation state include but are not limited to periodic acid, periodate salts, perbromic acid, perbromate salts, perchloric acid, perchloric salts, perbonic acid, nitrate salts (such as cerium nitrate, iron nitrate, ammonium nitrate), ferrates, perborate salts and permanganates. Other oxidizers include bromates, chlorates, chromates, iodates, iodic acid, and cerium (IV) compounds such as ammonium cerium nitrate.

One or more pH adjusting agents is preferably added to the bulk polishing composition to achieve a pH between about 2 and about 10, and preferably between a pH of about 3 and less than about 7, for example, a pH level between about 4 and about 6. The amount of pH adjusting agent can vary as the concentration of the other components is varied in different formulations, but in general the total solution may include up and about 70 wt % of the one or more pH adjusting agents, but preferably between about 0.2% and about 25% by volume. Different compounds may provide different pH levels for a given concentration, for example, the composition may include between about 0.1% and about 10% by volume of a base, such as potassium hydroxide, ammonium hydroxide, sodium hydroxide or combinations thereof, providing the desired pH level. The pH adjusting agent may also be added in solution or in a substantially pure form, for example, potassium hydroxide may be added in a 45% aqueous potassium hydroxide solution.

The one or more pH adjusting agents can be chosen from a class of organic acids, for example, carboxylic acids, such as acetic acid, citric acid, oxalic acid, phosphate-containing components including phosphoric acid, ammonium phosphates, potassium phosphates, and combinations thereof, or a combination thereof. Inorganic acids including phosphoric acid, sulfuric acid, hydrochloric, nitric acid, derivatives thereof and combinations thereof, may also be used as a pH adjusting agent in the bulk polishing composition.

The balance or remainder of the bulk polishing compositions described herein is a solvent, such as a polar solvent, including water, preferably deionized water. Other solvents may be used solely or in combination with water, such as organic solvents. Organic solvents include alcohols, such as isopropyl alcohol or glycols, ethers, such as diethyl ether, furans, such as tetrahydrofuran, hydrocarbons, such as pentane or heptane, aromatic hydrocarbons, such as benzene or toluene, halogenated solvents, such as methylene chloride or carbon tetrachloride, derivatives, thereof and combinations thereof.

In some embodiments of the bulk polishing composition may further include abrasive particles, and for residual compounds, may further include one or more oxidizers as described herein, abrasive particles, and combinations thereof. The addition of abrasives can further improve the removal rate of the complexed metal ions due to the abrasive particles ability to increase that contact area between the conductive article 610 and the substrate surface. The addition of abrasive particles to the bulk polishing composition can allow the final polished surface to achieve a surface roughness of that comparable with a conventional CMP process even at low article pressures. Surface finish, or surface roughness, has been shown to have an effect on device yield and post polishing surface defects.

Abrasive particles may comprise up and about 30 wt % of the bulk polishing composition during processing. A concentration between about 0.001 wt % and about 5 wt % of abrasive particles may be used in the bulk polishing composition. Suitable abrasives particles include inorganic abrasives, polymeric abrasives, and combinations thereof. Inorganic abrasive particles that may be used in the electrolyte include, but are not limited to, silica, alumina, zirconium oxide, titanium oxide, cerium oxide, germania, or any other abrasives of metal oxides, known or unknown. For example, colloidal silica may be positively activated, such as with an alumina modification or a silica/alumina composite.

The abrasives may also comprise polymeric abrasives. Examples of polymeric abrasives materials include polymethylmethacrylate, polymethyl acrylate, polystyrene, polymethacrylonitrile, and combinations thereof. The polymeric abrasives may have a Hardness Shore D of between about 60 and about 80, but can be modified to have greater or lesser hardness value. The softer polymeric abrasive particles can help reduce friction between a polishing article and substrate and may result in a reduction in the number and the severity of scratches and other surface defects as compared to inorganic particles. A harder polymeric abrasive particle may provide improved polishing performance, removal rate and surface finish as compared to softer materials. The hardness of the polymer abrasives can be varied by controlling the extent of polymeric cross-linking in the abrasives, for example, a higher degree of cross-linking produces a greater hardness of polymer and, thus, abrasive.

The polymeric abrasives may be modified to have one ore more functional groups that can bind to the conductive material or conductive material ions, thereby facilitating the electrochemical mechanical polishing removal of material from the surface of a substrate. For example, if copper is to be removed in the polishing process, the organic polymer particles can be modified to have an amine group, a carboxylate group, a pyridine group, a hydroxide group, ligands with a high affinity for copper, or combinations thereof, to bind the removed copper as substitutes for or in addition to the chemically active agents in the bulk polishing composition, such as the chelating agents or corrosion inhibitors. The substrate surface material, such as copper, may be in any oxidation state, such as 0, 1+, or 2+, before, during or after ligating with a functional group. The functional groups can bind to the metal material(s) on the substrate surface to help improve-the uniformity and surface finish of the substrate surface.

Additionally, the polymeric abrasives have desirable chemical properties, for example, the polymer abrasives are stable over a broad pH range and are not prone to aggregating to each other, which allow the polymeric abrasives to be used with reduced or no surfactant or no dispersing agent in the composition.

Alternatively, inorganic particles coated with the polymeric materials described herein may also be used with the bulk polishing composition. It is within the scope of the current invention for the bulk polishing composition to contain polymeric abrasives, inorganic abrasives, the polymeric coated inorganic abrasives, and any combination thereof depending on the desired polishing performance and results.

Optionally, ions of at least one transition metal, such as copper ions, may be added to the compositions described herein. The ions of at least one transition metal may be derived from metal salts, such as copper salts, and are added to the composition to form a complex with the one or more chelating agents. The resulting complex improves removal of conductive material from the substrate surface with reduced dishing. Examples of suitable copper salts include metal sulfates, meta fluoborate, metal gluconate, metal sulfamate, metal sulfonate, metal pyrophosphate, metal chloride, metal cyanide, metal nitrates, and combinations thereof, among others. For example, suitable copper salts include copper sulfate, copper fluoborate, copper gluconate, copper sulfamate, copper sulfonate, copper pyrophosphate, copper chloride, copper cyanide, nitrates, and combinations thereof. For example, the metal salt can comprise a concentration between about 0.005 weight percent (wt. %) and about 1.0 wt. % of the compositions, or alternatively, the matel salts may be present in the compositions at a concentration between about 0.05 wt. % and about 0.2 wt. % of the CMP composition.

The bulk polishing composition may include one or more additive compounds. Additive compounds include electrolyte additives including, but not limited to, suppressors, enhancers, levelers, brighteners, stabilizers, and stripping agents to improve the effectiveness of the polishing composition in polishing of the substrate surface. Other additives, such as surfactants may also be used with the polishing compositions described herein. For example, certain additives may decrease the ionization rate of the metal atoms, thereby inhibiting the dissolution process, whereas other additives may provide a finished, shiny substrate surface. The additives may be present in the bulk polishing composition in concentrations up and about 15% by weight or volume, and may vary based upon the desired result after polishing.

Further examples of additives to the bulk polishing composition are more fully described in U.S. Pat. No. 6,863,797, issue on Mar. 8, 2005, which is incorporated by reference herein to the extent not inconsistent with the claimed aspects and disclosure herein.

EXAMPLES

The following non-limiting examples are provided to further illustrate embodiments of the invention. However, the examples are not intended to be all-inclusive and are not intended to limit the scope of the invention described herein.

Example #1

A copper plated substrate was polished and planarized using the following polishing composition within a modified cell on a REFLEXION® system, available from Applied Materials, Inc. of Santa Clara, Calif. A substrate having a copper layer of about 11,500 Å thick on the substrate surface with a step height of about 6,000 Å was exposed to a polishing composition of:
  about 6% by volume phosphoric acid;
  about 2% by volume ethylenediamine;
  about 2% by weight ammonium citrate;
  about 0.3% by weight benzotriazole;
  between about 2% and about 6% by volume of potassium hydroxide to provide a pH of about 5; and
  deionized water, and a polishing article was contacted with the substrate at about 0.2 psi at a bias of about 3 watts/volts was applied during the process. The substrate was polishing and examined. A protrusion height of about 4,000 Å was observed over wide feature definitions.

Example #2

A copper plated substrate was polished and planarized using the following polishing composition within a modified cell on a REFLEXION® system, available from Applied Materials, Inc. of Santa Clara, Calif. A substrate having a copper layer of about 11,500 Å thick on the substrate surface with a step height of about 6,000 Å was exposed to a polishing composition of:
  about 6% by volume phosphoric acid;
  about 2% by volume ethylenediamine;
  about 2% by weight ammonium citrate;
  about 0.3% by weight benzotriazole;
  between about 2% and about 6% by volume of potassium hydroxide to provide a pH of about 5; and
  deionized water, and a polishing article was contacted with the substrate at about 0.2 psi at a bias of about 3 watts/volts was applied by a pulse technique of 10 seconds on and 2 seconds off for 8 of cycles. The substrate was polishing and examined. A protrusion height of about 1,500 Å was observed over wide feature definitions.

Example copper Ecmp polishing compositions for use with the first polishing step of a two step process include:

Example #3 about 6% by volume phosphoric acid,
  between about 1% and about 4% by weight ammonium citrate,
  between about 0.1% and about 0.4% by weight benzotriazole,
  deionized water, and
  between about 2% and about 6% by volume of potassium hydroxide to form a pH between about 4 and less than about 7.

Example #4 about 6% by volume phosphoric acid,
about 2% by volume ethylenediamine,
between about 1% and about 4% by weight ammonium citrate,
between about 0.1% and about 0.4% by weight benzotriazole,
between about 0.1% and about 3% by volume or weight, for example, about 0.45% hydrogen peroxide, and/or about between about 0.01% and 1% by weight, for example 0.15% by weight, of abrasive particles,
deionized water, and
between about 2% and about 6% by volume of potassium hydroxide to form a pH between about 4 and less than about 7.

Example copper Ecmp polishing compositions for use with the second conductive material polishing step of a two step process include:

Example #5 between about 4% and about 6% by volume phosphoric acid,
about 2% by volume ethylenediamine,
between about 1% and about 4% by weight ammonium citrate,
between about 0.05% and about 0.3% by weight benzotriazole,
between about 0.1% and about 3% by volume or weight, for example, about 0.45% hydrogen peroxide, and/or about between about 0.01% and 1% by weight, for example 0.15% by weight, of abrasive particles,
deionized water,
and between about 2% and about 6% by volume of potassium hydroxide to form a pH between about 4 and about 6.

Example #6 about 3% by volume nitric acid;
about 2% by volume ethylenediamine;
about 2% by weight ammonium citrate;
between about 0.1% and about 0.3% by weight benzotriazole;
between about 2% and about 6% by volume of potassium hydroxide and or ammonium hydroxide to provide a pH of between about 4 and about 6; and
deionized water.

Example #7 about 4% by volume phosphoric acid;
about 2% by volume ethylenediamine;
about 2% by weight ammonium citrate;
between about 0.1% and about 0.3% by weight benzotriazole;
between about 2% and about 6% by volume of potassium hydroxide and or ammonium hydroxide to provide a pH of between about 4 and about 6; and
deionized water.

Example #8 about 4% by volume phosphoric acid;
about 2% by volume ethylenediamine;
about 2% by weight glycine;
between about 0.1% and about 0.3% by weight benzotriazole;
between about 2% and about 6% by volume of potassium hydroxide and or ammonium hydroxide to provide a pH of between about 4 and about 6; and
deionized water.

Example #9 about 3% by volume phosphoric acid,
about 2% citric acid,
about 0.05% by weight benzotriazole,
deionized water, sufficient potassium hydroxide to form a pH between about 4 and about 6, and
optionally, hydrogen peroxide and/or abrasive particles.

Example #10 about 1% by volume phosphoric acid,
about 2% by volume ethylenediamine,
about 0.02% by weight benzotriazole,
between about 0.1 vol % and about 5 vol % hydrogen peroxide,
deionized water,
and sufficient potassium hydroxide to form a pH between about 5 and about 7.

Example #11 about 1% by volume phosphoric acid,
about 2% by volume citric acid,
about 0.03% by weight benzotriazole,
between about 0.1 vol % and about 5 vol % hydrogen peroxide,
deionized water,
and sufficient potassium hydroxide to form a pH between about 4 and about 7.

Example #12 about 4% by volume nitric acid;
about 2% by volume ethylenediamine;
about 2% by weight ammonium citrate;
between about 0.05% and about 0.2% by weight benzotriazole;
between about 2% and about 6% by volume of potassium hydroxide and or ammonium hydroxide to provide a pH of between about 4 and about 6; and
deionized water.

Example #13 about 4% by volume phosphoric acid;
about 2% by volume ethylenediamine;
about 2% by weight glycine;
between about 0.05% and about 0.2% by weight benzotriazole;
between about 2% and about 6% by volume of potassium hydroxide and or ammonium hydroxide to provide a pH of between about 4 and about 6; and
deionized water.

Example #14 about 4% by volume phosphoric acid;
about 2% by volume ethylenediamine;
about 2% by weight citric acid;

between about 0.05% and about 0.2% by weight benzotriazole;
between about 2% and about 6% by volume of potassium hydroxide and or ammonium hydroxide to provide a pH of between about 4 and about 6; and
deionized water Example #15 about 2% by volume phosphoric acid;
about 2% by volume ethylenediamine;
about 2% by weight glycine;
between about 0.05% and about 0.2% by weight benzotriazole;
between about 2% and about 6% by volume of potassium hydroxide and or ammonium hydroxide to provide a pH of between about 4 and about 6; and
deionized water.

Example #16 about 2% by volume phosphoric acid;
about 2% by weight glycine;
between about 0.05% and about 0.2% by weight benzotriazole;
between about 2% and about 6% by volume of potassium hydroxide and or ammonium hydroxide to provide a pH of between about 4 and about 6; and
deionized water.

Example #17 about 2% by volume phosphoric acid;
about 2% by weight citric acid;
between about 0.05% and about 0.2% by weight benzotriazole;
between about 2% and about 6% by volume of potassium hydroxide and or ammonium hydroxide to provide a pH of between about 4 and about 6; and
deionized water.

Example #18 about 2% by volume nitric acid;
about 2% by weight citric acid;
between about 0.05% and about 0.2% by weight benzotriazole;
between about 2% and about 6% by volume of potassium hydroxide and or ammonium hydroxide to provide a pH of between about 4 and about 6; and
deionized water.

Example #19 about 1% by volume phosphoric acid;
about 1% by weight citric acid;
between about 0.05% and about 0.2% by weight benzotriazole;
between about 2% and about 6% by volume of potassium hydroxide and or ammonium hydroxide to provide a pH of between about 4 and about 6;
about 1% hydrogen peroxide; and
deionized water.

While the foregoing is directed to embodiments of the present invention, other and further embodiments of the invention may be devised without departing from the basic scope thereof, and the scope thereof is determined by the claims that follow.

What is claimed is:

1. A method of processing a substrate having a barrier material layer disposed over narrow feature definitions and wide feature definitions and the field areas between the feature definitions and a conductive material layer disposed on the barrier material layer, comprising:
    forming a protrusion in residual conductive material disposed over wide feature definitions by a first electrochemical mechanical polishing process to remove bulk conductive material; and
    removing the protrusion in the residual conductive material by at least a chemical mechanical polishing technique to expose the underlying barrier material layer on the field areas between the wide and the narrow feature definitions.

2. The method of claim 1, wherein the first electrochemical mechanical polishing process is performed on a first platen and the chemical mechanical polishing technique is performed on a second platen.

3. The method of claim 1, wherein the polishing the substrate by at least a chemical mechanical polishing process comprises a second electrochemical mechanical polishing process.

4. The method of claim 1, further comprising removing at least a portion of the barrier material layer by at least a chemical mechanical polishing technique.

5. The method of claim 4, wherein the removing the protrusion in the residual conductive material and removing at least a portion of the barrier material layer are performed using the same chemical mechanical polishing technique.

6. The method of claim 1, wherein the first electrochemical mechanical polishing process comprises a first composition having a first corrosion inhibitor concentration and the at least the chemical mechanical polishing technique comprises a second composition having a second corrosion inhibitor concentration less than the first corrosion inhibitor concentration.

7. The method of claim 1, wherein the first electrochemical mechanical polishing process comprises a first composition having a first pH level and the at least the chemical mechanical polishing technique comprises a second pH level more acidic than the first pH level.

8. The method of claim 1, wherein the first electrochemical mechanical polishing process comprises an abrasive containing composition and the at least the chemical mechanical polishing technique comprises an abrasive-free composition.

9. The method of claim 3, wherein the first electrochemical mechanical polishing process comprises applying a pulse modulation first bias to form the protrusion and the second electrochemical mechanical polishing process comprises applying a second bias to form a protrusion.

10. The method of claim 3, wherein the second electrochemical polishing process has a composition comprising:
    an acid based electrolyte;
    a polishing enhancing material selected from the group of a chelating agent, an inorganic or organic acid salt, or combinations thereof;
    a corrosion inhibitor;
    a solvent; and
    a pH adjusting agent to provide a pH between about 3 and about 10.

11. The method of claim 1, further comprising removing the barrier material layer by at least a chemical mechanical polishing technique.

12. A method of processing a substrate having a conductive material layer disposed thereon over narrow apertures and wide apertures, comprising:
  removing conductive material disposed over narrow apertures at a higher removal rate than conductive material disposed over wide apertures by a first electrochemical mechanical polishing technique; and
  removing conductive material disposed over wide apertures at a removal rate greater than or equal to the removal rate of conductive material disposed over narrow apertures by a second electrochemical mechanical polishing technique.

13. The method of claim 12, wherein the first electrochemical mechanical polishing technique comprises a first composition having a first concentration of corrosion inhibitor and the second electrochemical mechanical polishing technique comprises a second composition having a second concentration of corrosion inhibitor less than the first concentration of corrosion inhibitor.

14. The method of claim 13, wherein the first concentration of corrosion inhibitor comprises about 0.3 wt.% or greater of corrosion inhibitor and the second concentration of corrosion inhibitor comprises about less than about 0.3 wt.% of corrosion inhibitor.

15. The method of claim 12, wherein the first electrochemical mechanical polishing technique comprises a first composition having a first pH and the second electrochemical mechanical polishing technique comprises a second composition having a second pH more acidic than the first pH.

16. The method of claim 15, the first electrochemical mechanical polishing technique comprises a first pulse modulation method and the second electrochemical mechanical polishing technique comprises applying bias by a second pulse modulation method.

17. The method of claim 16, wherein the first pulse modulation technique removes conductive material disposed over narrow apertures at a higher removal rate than conductive material disposed over wide apertures and the second pulse modulation technique removes conductive material disposed over narrow apertures at a lesser removal rate than conductive material disposed over wide apertures.

18. The method of claim 15, wherein the pulse modulation technique forms a protrusion between 10% and about 60% of a thickness of the conductive material over the wide apertures.

19. The method of claim 12, wherein the first electrochemical mechanical polishing process comprises an abrasive containing composition and the at least the chemical mechanical polishing technique comprises an abrasive-free composition.

20. The method of claim 19, wherein the second electrochemical mechanical polishing technique and the removing the barrier material layer are performed on the same platen.

* * * * *